(12) United States Patent
Shimura

(10) Patent No.: US 8,704,289 B2
(45) Date of Patent: Apr. 22, 2014

(54) NONVOLATILE SEMICONDUCTOR MEMORY DEVICE

(75) Inventor: Yasuhiro Shimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,792

(22) Filed: Sep. 4, 2012

(65) Prior Publication Data

US 2013/0234225 A1    Sep. 12, 2013

(30) Foreign Application Priority Data

Dec. 27, 2011  (JP) .................................. 2011-286515
Dec. 28, 2011  (JP) .................................. 2011-287855

(51) Int. Cl.
*H01L 29/792*    (2006.01)
*H01L 29/788*    (2006.01)

(52) U.S. Cl.
USPC ................... 257/324; 257/316; 257/E27.103; 257/E29.129

(58) Field of Classification Search
CPC ............... H01L 29/792; H01L 27/115; H01L 27/11568; H01L 29/788
USPC .................. 257/316, 324, E27.103, E29, 129
See application file for complete search history.

(56) References Cited

U.S. PATENT DOCUMENTS

| | | | |
|---|---|---|---|
| 6,933,218 B1* | 8/2005 | Lee et al. ....................... | 438/591 |
| 7,612,404 B2* | 11/2009 | Yamamoto et al. ........... | 257/321 |
| 8,110,865 B2 | 2/2012 | Tanaka et al. | |
| 2004/0018682 A1* | 1/2004 | Iguchi et al. .................. | 438/257 |
| 2008/0087937 A1* | 4/2008 | Akahori et al. ............... | 257/316 |
| 2010/0155812 A1 | 6/2010 | Morikado et al. | |
| 2010/0308393 A1 | 12/2010 | Matsuo et al. | |
| 2011/0001180 A1 | 1/2011 | Masuda et al. | |
| 2011/0133267 A1* | 6/2011 | Matsuo et al. ................ | 257/316 |

FOREIGN PATENT DOCUMENTS

| | | |
|---|---|---|
| JP | 2007-305966 | 11/2007 |
| JP | 2010-147414 | 7/2010 |
| JP | 2010-283127 | 12/2010 |
| JP | 2011-14838 | 1/2011 |

* cited by examiner

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a nonvolatile semiconductor memory includes a gate insulating film, a floating gate, first and second silicon oxide films, an insulating film and a control gate. The floating gate is formed on the gate insulating film. The first silicon oxide film is formed on an upper surface of the floating gate. The insulating film is formed on the first silicon oxide film on the upper surface of the floating gate and has a dielectric constant higher than that of the silicon oxide film. The second silicon oxide film is formed on the insulating film on the upper surface of the floating gate and on a side surface of the floating gate. The control gate is formed on the second silicon oxide film formed on the upper and side surfaces of the floating gate.

20 Claims, 26 Drawing Sheets

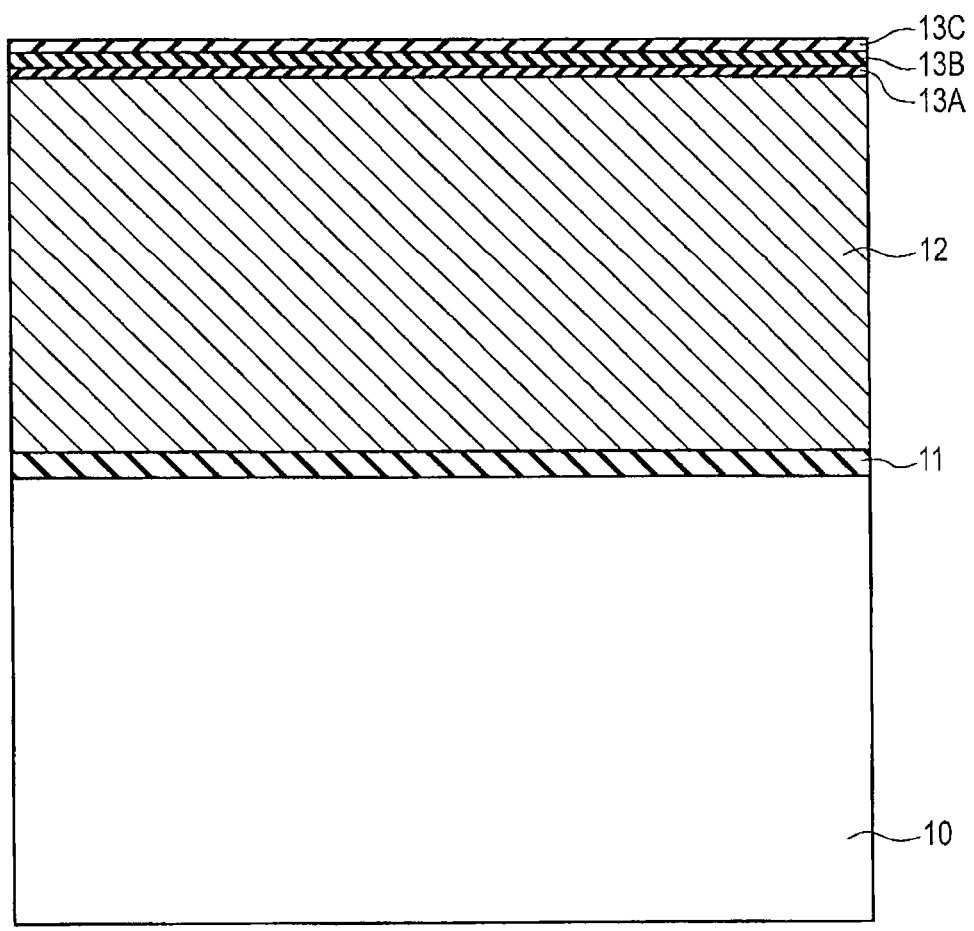
F I G. 5

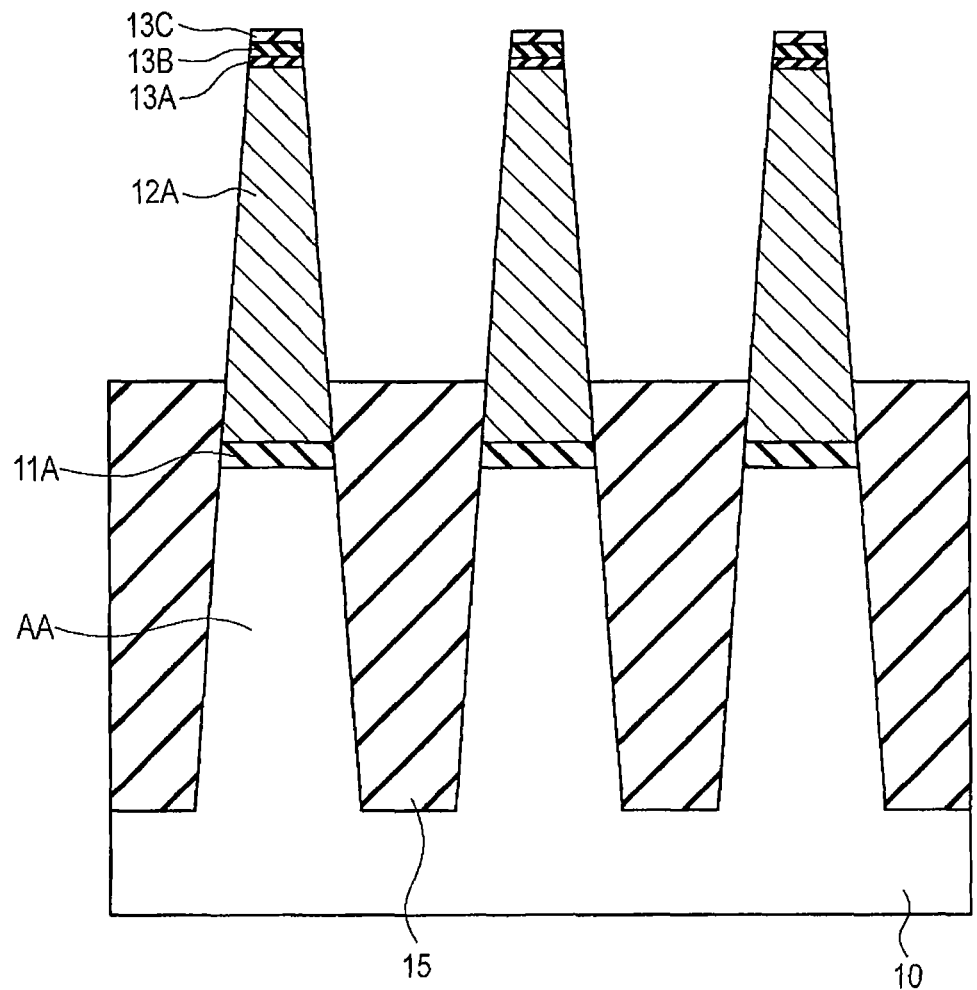
F I G. 6

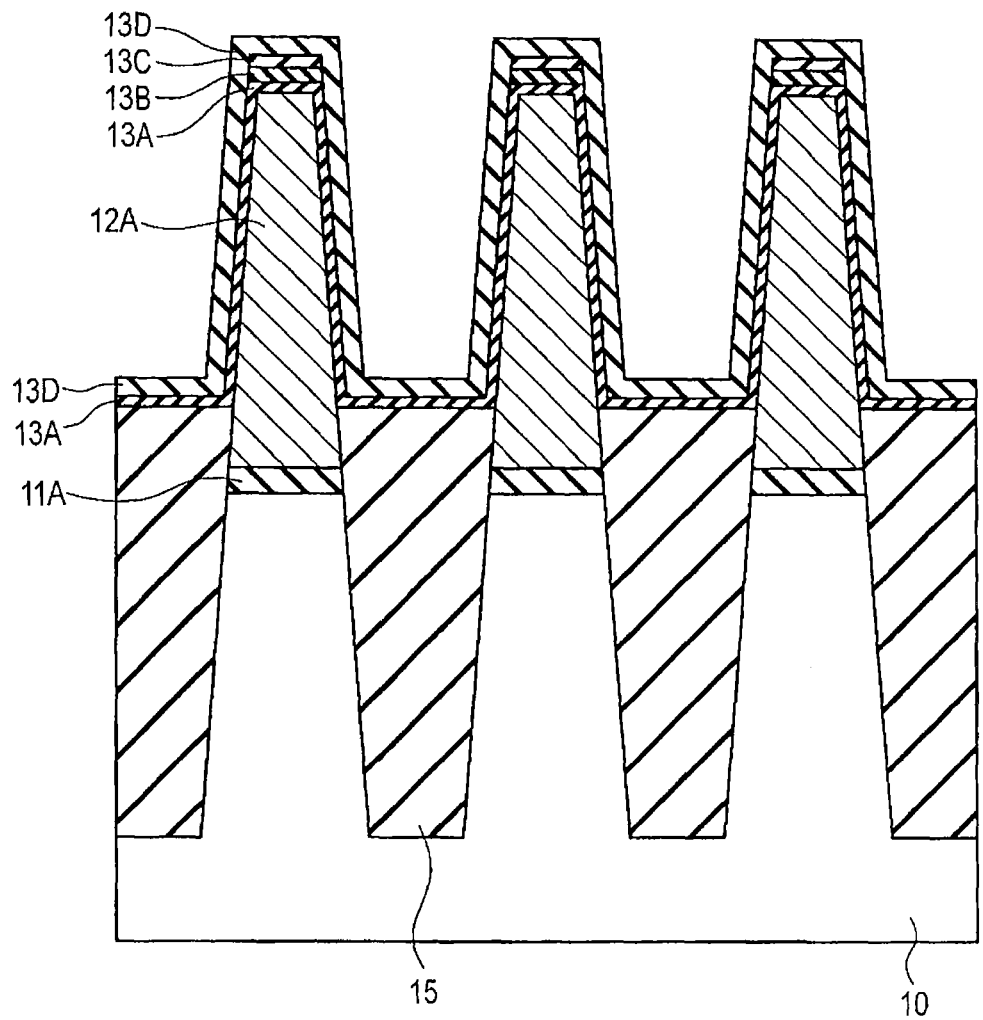
F I G. 8

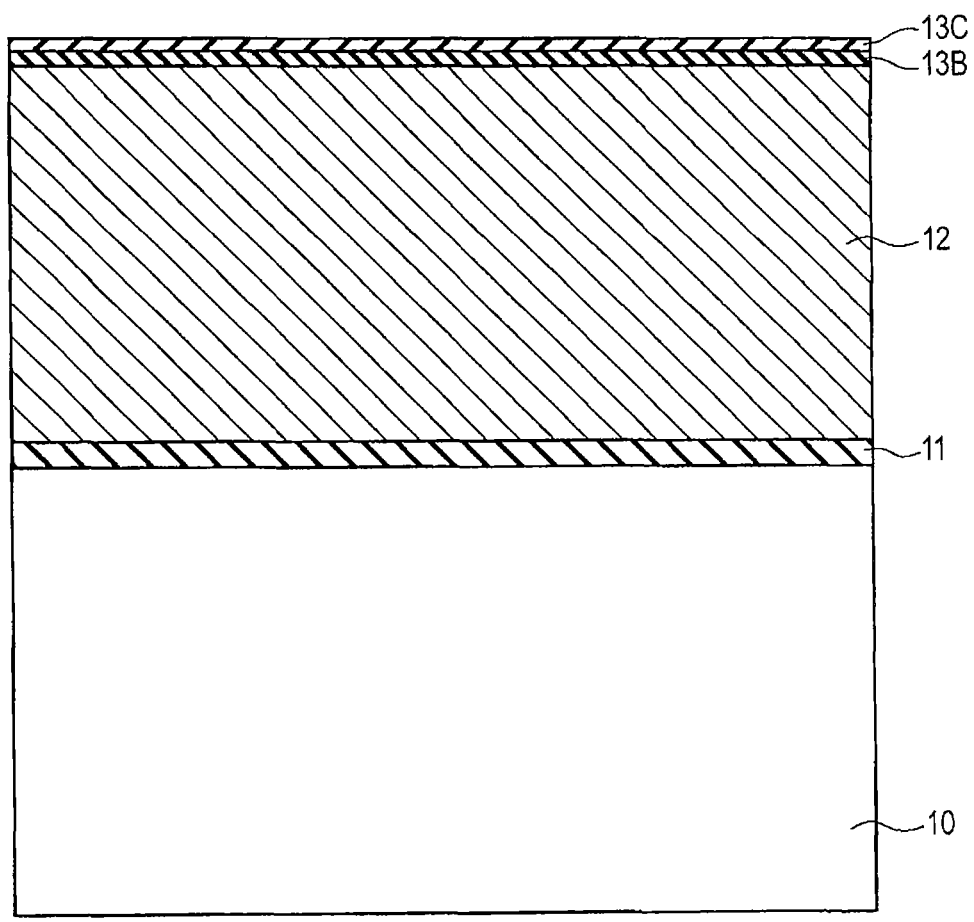
F I G. 12

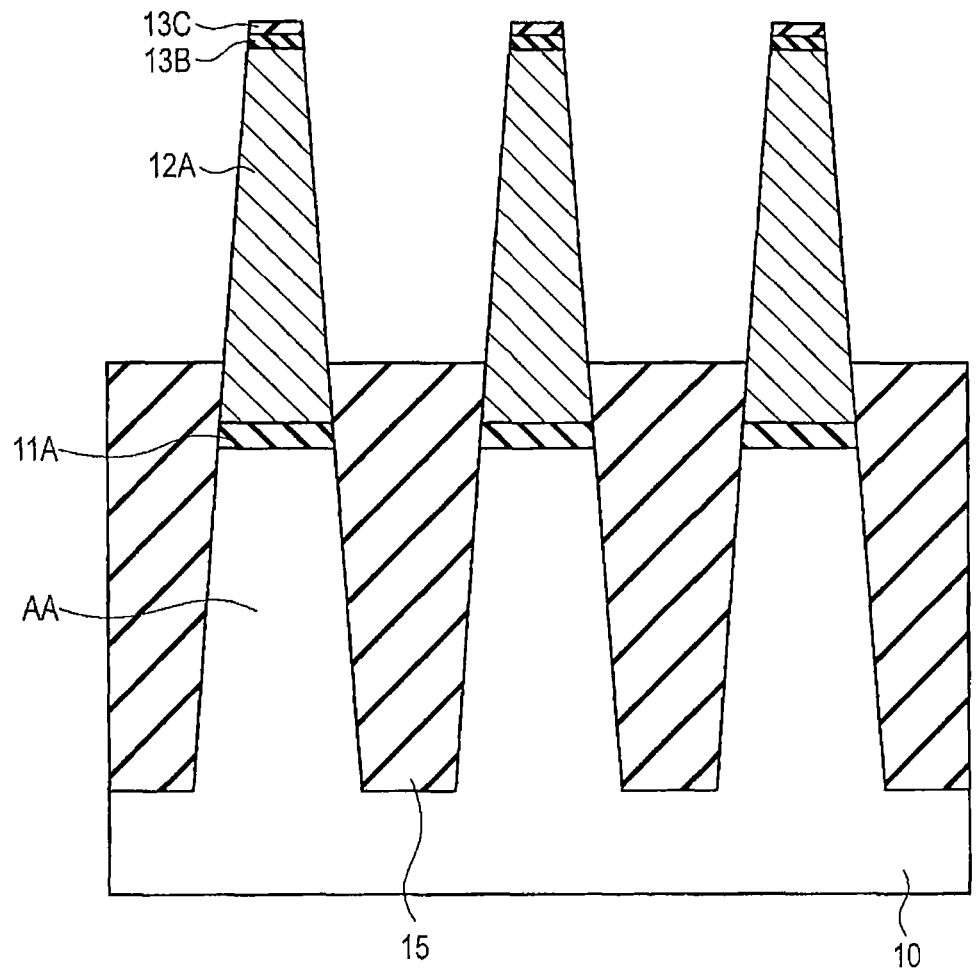
F I G. 13

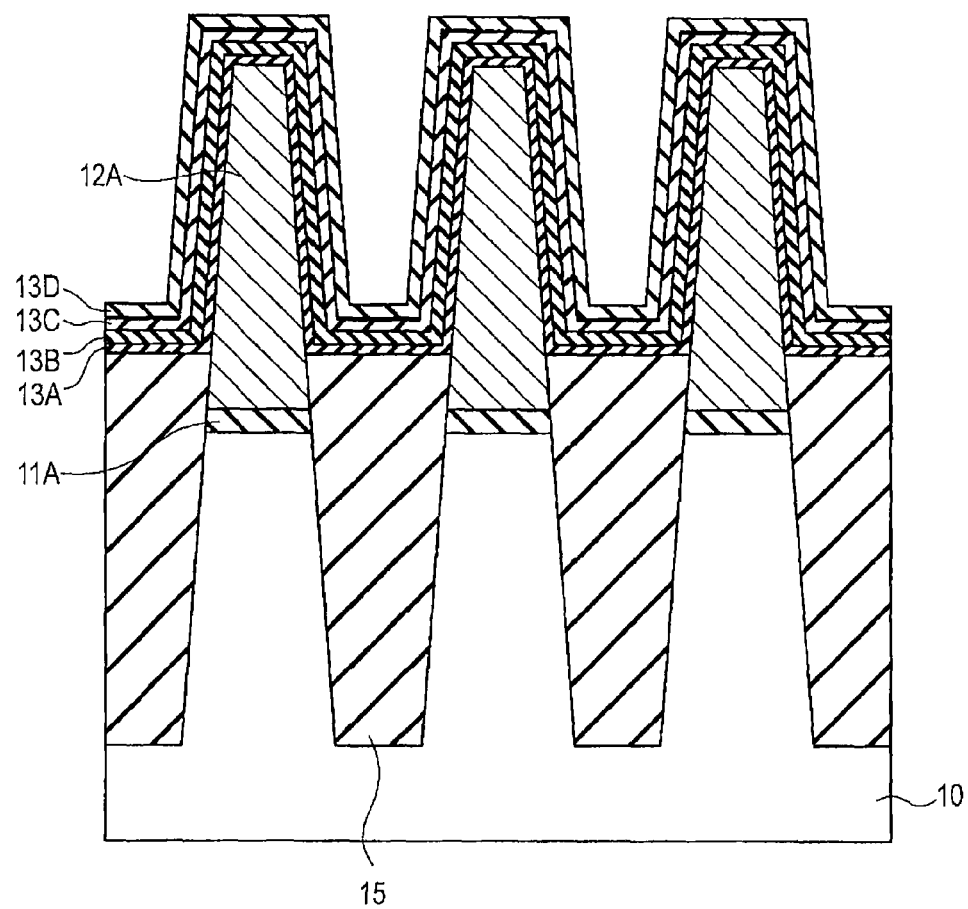
F I G. 20

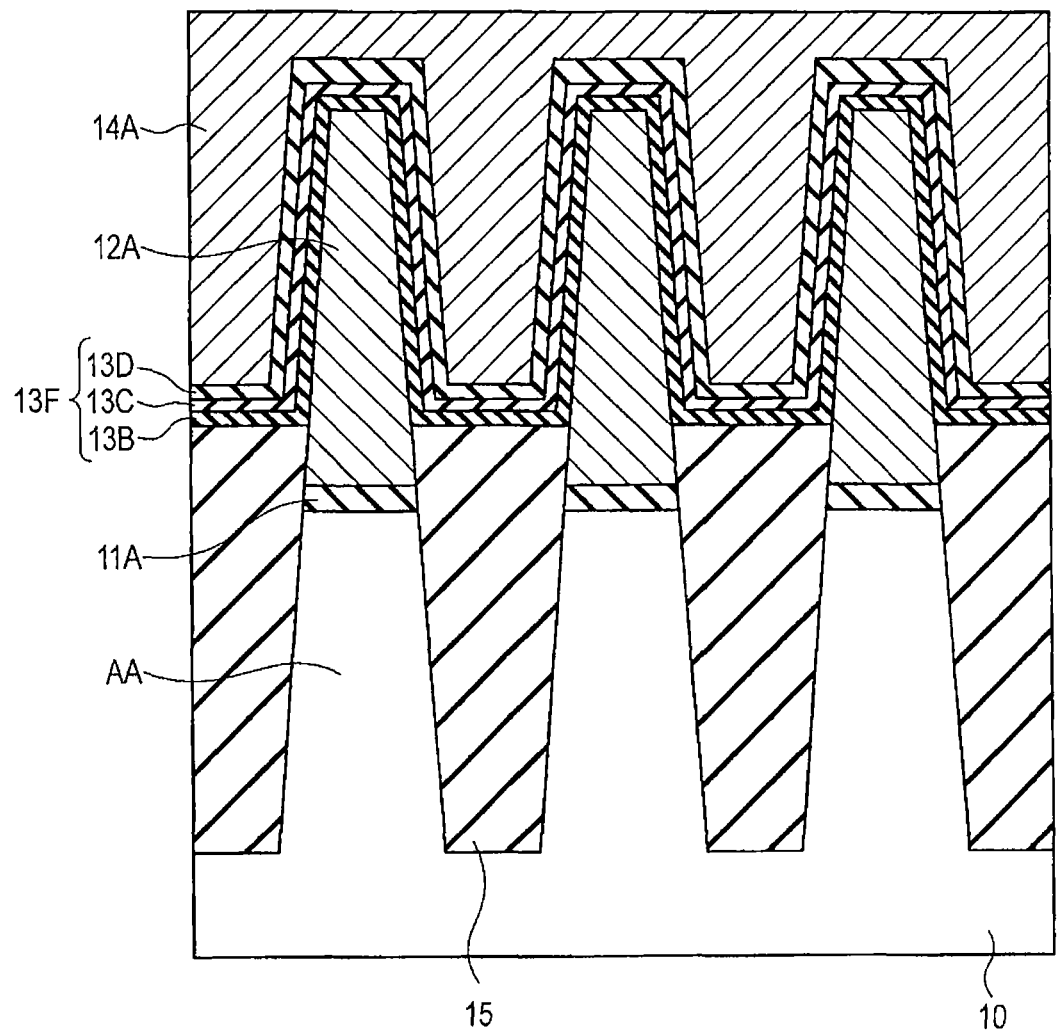
F I G. 23

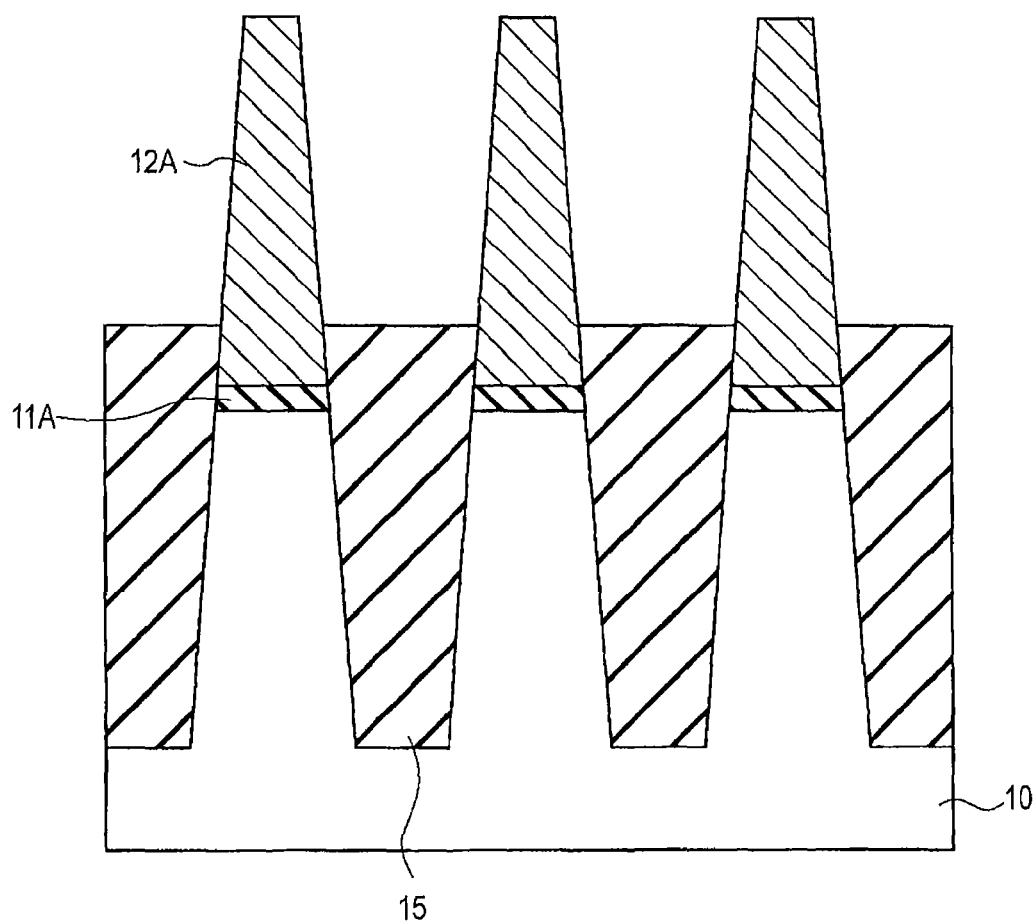
F I G. 24

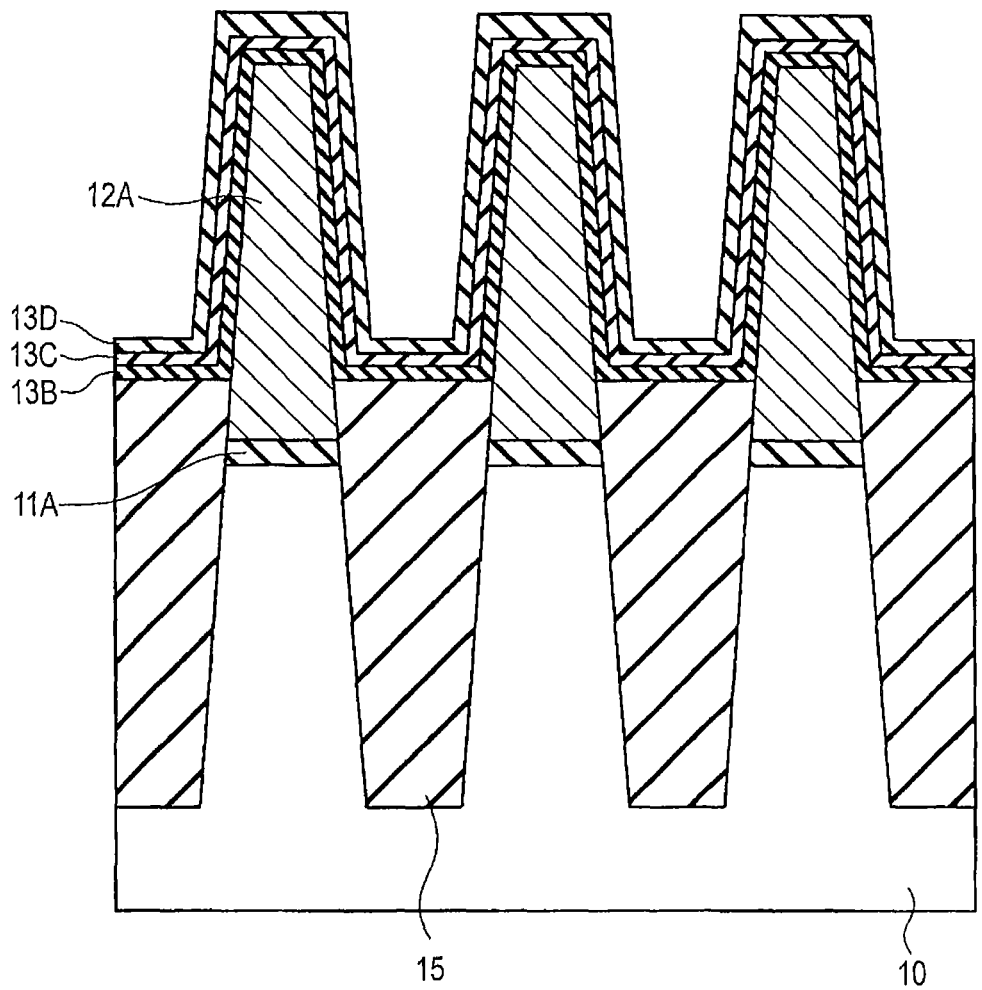
F I G. 26

NONVOLATILE SEMICONDUCTOR MEMORY DEVICE

CROSS-REFERENCE TO RELATED APPLICATIONS

This application is based upon and claims the benefit of priority from Japanese Patent Applications No. 2011-286515, filed Dec. 27, 2011; and No. 2011-287855, filed Dec. 28, 2011, the entire contents of all of which are incorporated herein by reference.

FIELD

Embodiments described herein relate generally to a nonvolatile semiconductor memory device.

BACKGROUND

For example, a floating gate NAND flash memory which is a nonvolatile semiconductor memory device has a memory cell of a stack gate structure in which a gate insulating film (tunnel insulating film), a floating gate electrode, a gate insulating film (intergate insulating film), and a control gate electrode are stacked. In this memory cell structure, the upper part of the floating gate electrode becomes thinner along with the advance of generations, and the concentration of an electric field in this upper part is increased, so that a leakage current in the intergate insulating film is increased during writing.

Therefore, when the above-mentioned memory cell is miniaturized with no change of the conventional structure, electrons injected into the floating gate electrode escape toward the control gate electrode because of the increased leakage current even though a high write voltage is applied to increase a tunnel current passing through the tunnel insulating film and thereby increase the amount of electrons injected into the floating gate electrode. Consequently, a multivalued memory cell may reach write saturation that prevents writing up to a threshold necessary for multivalue writing.

BRIEF DESCRIPTION OF THE DRAWINGS

FIGS. 4 to 9 are sectional views showing a method of manufacturing a memory cell array in the nonvolatile semiconductor memory device according to the first embodiment;

FIGS. 10 to 14 are sectional views showing the configuration of a nonvolatile semiconductor memory device according to a second embodiment;

FIGS. 18 to 22 are sectional views showing a method of manufacturing a memory cell array in the nonvolatile semiconductor memory device according to the third embodiment;

FIG. 23 is a sectional view showing the configuration of a nonvolatile semiconductor memory device according to a fourth embodiment; and FIGS. 24 to 26 are sectional views showing a method of manufacturing a memory cell array in the nonvolatile semiconductor memory device according to the fourth embodiment.

DETAILED DESCRIPTION

Hereinafter, a nonvolatile semiconductor memory device according to embodiments is described with reference to the drawings. Here, a NAND flash memory is shown as an example of the nonvolatile semiconductor memory device. In the following explanation, components having the same functions and configurations are provided with the same reference signs and are repeatedly described only when necessary.

In general, according to one embodiment, a nonvolatile semiconductor memory device includes a gate insulating film, a floating gate electrode, a first silicon oxide film, an insulating film, a second silicon oxide film and a control gate electrode. The gate insulating film is formed on a semiconductor substrate. The floating gate electrode is formed on the gate insulating film. The first silicon oxide film is formed on an upper surface of the floating gate electrode. The insulating film is formed on the first silicon oxide film on the upper surface of the floating gate electrode. The insulating film has a dielectric constant higher than that of the silicon oxide film. The second silicon oxide film is formed on the insulating film on the upper surface of the floating gate electrode and on a side surface of the floating gate electrode. The control gate electrode is formed on the second silicon oxide film formed on the upper surface and side surface of the floating gate electrode.

First Embodiment

[1] Configuration of Memory Cell Array

Figure 1:
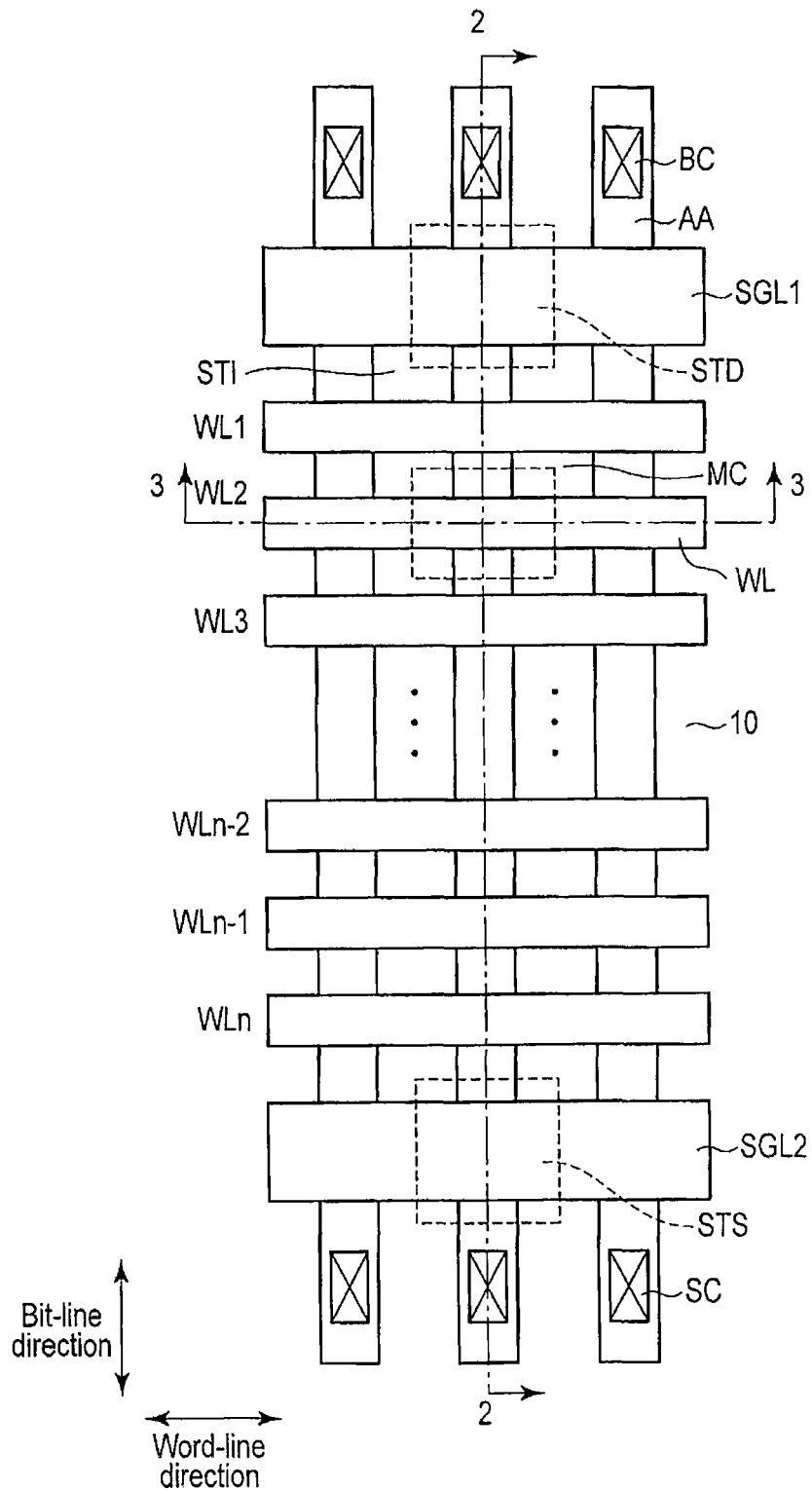
FIG. 1 is a plan view showing the configuration of a nonvolatile semiconductor memory device according to a first embodiment.
Figure 2:
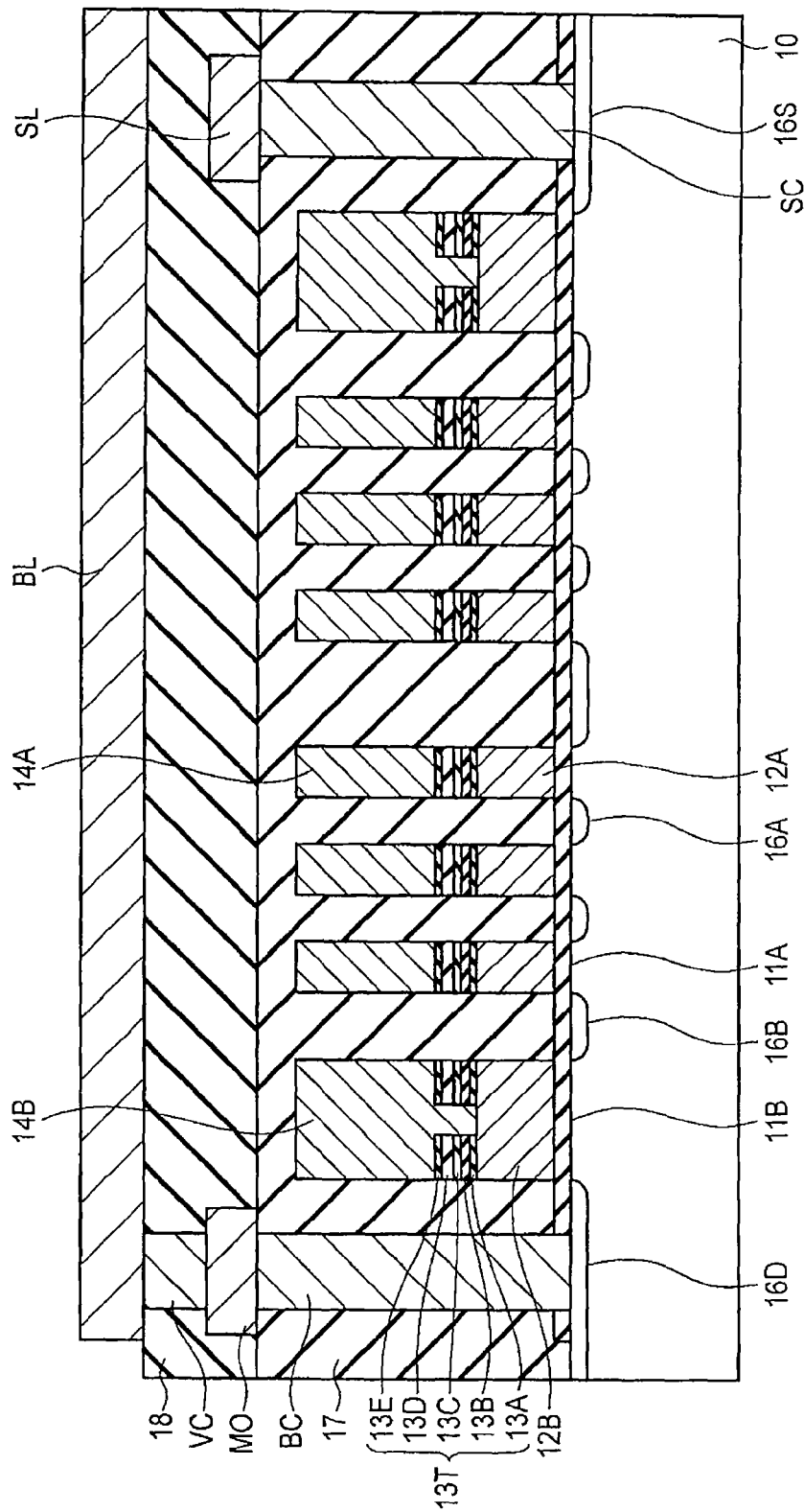
FIG. 2 is a sectional view taken along line 2-2 in FIG. 1.
Figure 3:
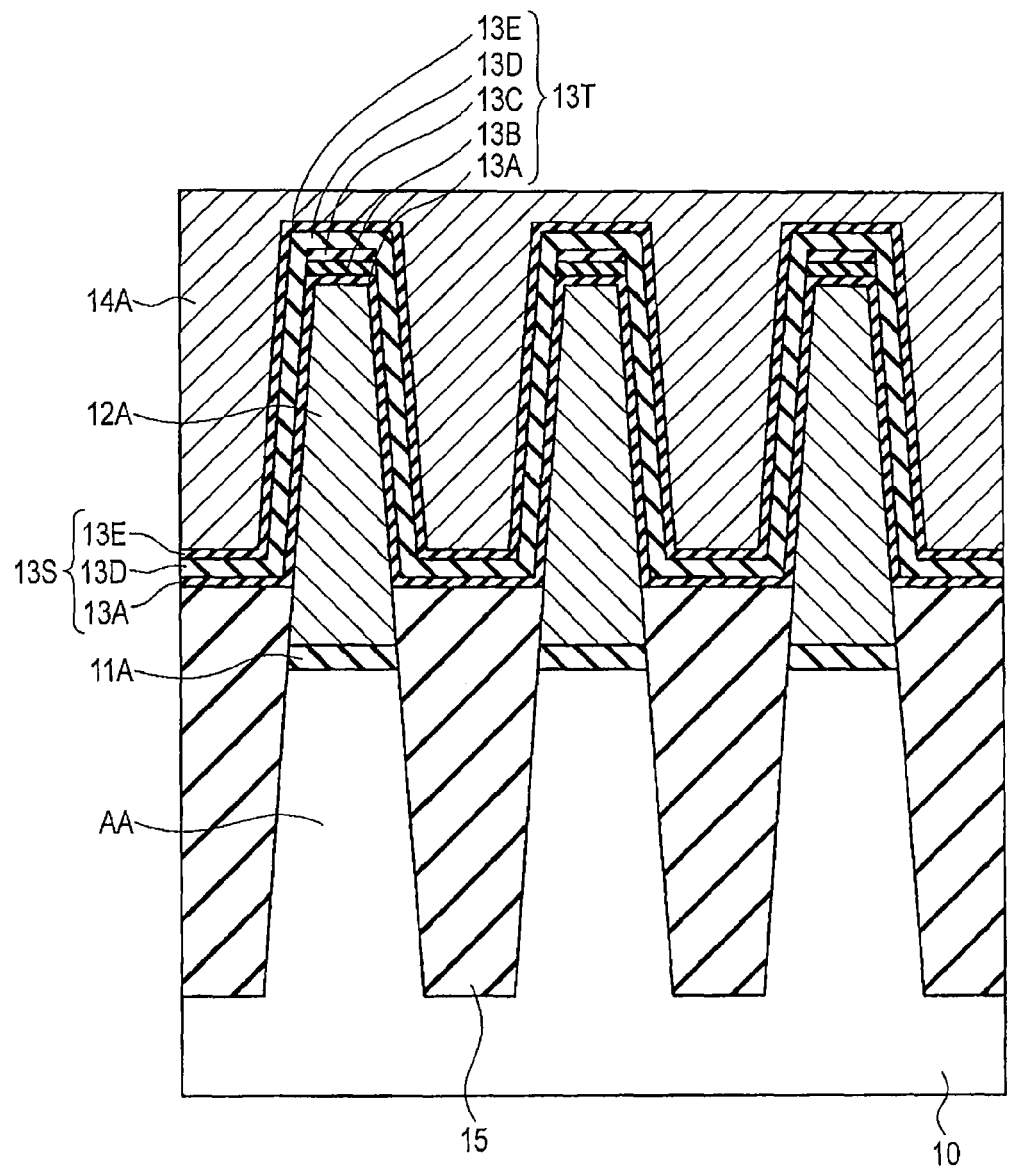
FIG. 3 is a sectional view taken along line 3-3 in FIG. 1.

FIG. 1 is a plan view showing the configuration of a memory cell array in a NAND flash memory according to the first embodiment. FIG. 2 is a sectional view taken along line 2-2 in FIG. 1. FIG. 3 is a sectional view taken along line 3-3 in FIG. 1. FIG. 2 shows a section along the channel length direction (bit-line direction) of a memory cell MC. FIG. 3 shows a section along the channel width direction (word-line direction) of the memory cell MC.

As shown in FIG. 1, an element isolation region, and element regions (active areas) AA isolated by the element isolation region are formed in the surface region of a semiconductor substrate 10. The element regions AA are arranged in the word-line direction, and each of the element regions AA extends in the bit-line direction. A plurality of memory cells MC and select transistors STD and STS are formed on the element region AA.

The memory cells MC arranged on the element region AA are connected in series. The memory cells MC connected in series will hereinafter be referred to as a memory string. Select transistors STD and STS are located at both ends of this memory string. Further, a configuration including the memory string and select transistors STD and STS will hereinafter be referred to as a NAND cell unit.

Word lines WL (WL1 to WLn) and select gate lines SGL1 and SGL2 are arranged in the bit-line direction, and each of these lines extends in the word-line direction. That is, the word lines WL (WL1 to WLn) and select gate lines SGL1 and SGL2 are disposed to intersect at right angles with the element regions AA.

A plurality of NAND cell units are arranged in the word-line direction. The memory cells MC of the NAND cell units are respectively connected to the word lines WL (WL1 to WLn). Here, the memory cells MC located in the word-line direction are connected to the common word line WL. Further, select transistors STD and STS are respectively connected to select gate lines SGL1 and SGL2.

One end of the NAND cell unit is connected, via a bit-line contact BC, to a bit line (not shown) extending in the same direction as the element region AA. The other end of the NAND cell unit is connected, via a source-line contact SC, to a source line (not shown) extending in the word-line direction.

Now, the sectional structure of the memory cell array according to the first embodiment is described.

As shown in FIG. 2 and FIG. 3, the memory cell MC is a memory cell transistor having a stack gate structure in which a control gate electrode 14A is stacked on a floating gate electrode 12A.

A well region (not shown) is provided in the semiconductor substrate 10, and the NAND cell unit is formed on the well region. An element isolation region 15, and the element regions AA isolated by the element isolation region 15 are arranged in the surface region of the semiconductor substrate 10.

Disposed on the semiconductor substrate (element region AA) 10 are the memory cell MC including a gate insulating film 11A, the floating gate electrode 12A, an intergate insulating film 13T, and the control gate electrode 14A, and select transistors STD and STS including a gate insulating film 11B, a bottom gate electrode 12B, an intergate insulating film 13T, and a top gate electrode 14B.

The gate insulating film 11A is formed on the element region AA. This gate insulating film 11A functions as a tunnel insulating film between the element region AA and the floating gate electrode 12A. The gate insulating film 11A of the memory cell MC will hereinafter be referred to as a tunnel insulating film.

The floating gate electrode 12A is formed on the tunnel insulating film 11A. The floating gate electrode 12A functions as a charge storage layer to hold data written to the memory cell MC. This floating gate electrode 12A is made of, for example, a polysilicon film.

The floating gate electrodes 12A of the memory cells MC arranged on the element regions AA adjacent in the channel width direction (word-line direction) are electrically insulated by the element isolation region 15 embedded in the semiconductor substrate 10. Here, the upper surface of the element isolation region 15 is set back toward the semiconductor substrate 10 in comparison with the upper surface of the floating gate electrode 12A. That is, the upper surface of the element isolation region 15 is located higher than the lower surface of the floating gate electrode 12A and lower than the upper surface of the floating gate electrode 12A.

Intergate insulating film 13T is formed on the upper surface of the floating gate electrode 12A, and an intergate insulating film 13S is formed on the side surface of the floating gate electrode 12A and on the element isolation region 15.

Intergate insulating film 13T formed on the upper surface of the floating gate electrode 12A has a stack film (what is known as a NONON film) in which a bottom silicon nitride film 13A, a bottom silicon oxide film 13B, an insulating film (for example, center silicon nitride film) 13C, a top silicon oxide film 13D, and a top silicon nitride film 13E are stacked in this order from the side of the floating gate electrode 12A. The symbol "N" denotes a silicon nitride film, and the symbol "O" denotes a silicon oxide film.

Intergate insulating film 13S formed on the side surface of the floating gate electrode 12A and on the element isolation region 15 has a stack film (what is known as a NON film) in which a bottom silicon nitride film 13A, a top silicon oxide film 13D, and a top silicon nitride film 13E are stacked in this order from the side of the floating gate electrode 12A and the element isolation region 15.

Intergate insulating film 13T on the upper surface of the floating gate electrode 12A has the insulating film (for example, center silicon nitride film) 13C, and intergate insulating film 13S on the side surface of the floating gate electrode 12A does not have the insulating film 13C.

The materials used for intergate insulating films 13T and 13S are not limited to the above-mentioned materials, and other materials may be used instead. A silicon oxynitride (SiON) film or a metal oxide film may be used for the insulating film 13C instead of an insulating (high-k) film such as the above-mentioned silicon nitride (SiN) film having a dielectric constant higher than that of the silicon oxide film. The metal oxide film includes, for example, aluminum oxide ($Al_2O_3$), hafnium oxide ($HfO_2$), yttrium oxide ($Y_2O_3$), lanthanum oxide ($La_2O_3$), lanthanum aluminate ($LaAlO_3$), hafnium aluminate (HfAlOx), tantalum oxide ($Ta_2O_5$), and titanium oxide ($TiO_2$). These materials are not limited to the composition ratios in parentheses.

Intergate insulating film 13T on the upper surface of the floating gate electrode 12A has a five-layer structure (NONON film), and intergate insulating film 13S on the side surface of the floating gate electrode 12A and on the element isolation region 15 has a three-layer structure (NON film). However, these intergate insulating films are not limited to such multilayer structures, may have other multilayer structures.

The control gate electrode 14A is formed on intergate insulating films 13T and 13S. That is, the control gate electrode 14A is disposed on the upper surface of the floating gate electrode 12A via intergate insulating film 13T. The control gate electrode 14A is disposed on the side surface of the floating gate electrode 12A via intergate insulating film 13S. The control gate electrode 14A is equivalent to the word line WL.

For example, a silicide film is used for the control gate electrode 14A to reduce electric resistance. However, the control gate electrode 14A is not limited to the silicide film, and may have a single-layer structure of a polysilicon film or a double-layer structure (polycide structure) in which a polysilicon film and a silicide film are stacked. As the silicide film, for example, a tungsten silicide film, a molybdenum silicide film, a cobalt silicide film, a titanium silicide film, or a nickel silicide film is used.

The control gate electrode 14A functions as a word line, and is shared between the adjacent memory cells MC. Therefore, the control gate electrode 14A is formed not only on the floating gate electrode 12A but also on the element isolation region 15.

As shown in FIG. 2, source/drain diffusion layers 16A of the memory cell MC are formed in the semiconductor substrate 10. The source/drain diffusion layers 16A are formed in the element regions AA on both sides of the memory cell MC, and shared between the adjacent memory cells MC. Accordingly, the memory cells MC are connected in series, and one memory cell string is formed.

Select transistors STD and STS are formed at one end and the other of the memory cells MC connected in series, that is, the memory cell string.

Select transistors STD and STS are formed in a process similar to that of the memory cells MC. Therefore, in the gate structure of each of select transistors STD and STS, the top gate electrode 14B is stacked on the bottom gate electrode 12B via intergate insulating film 13T. The bottom gate electrode 12B has the same structure as the floating gate electrode 12A, and the top gate electrode 14B has the same structure as the control gate electrode 14A.

However, in select transistors STD and STS, intergate insulating film 13T has an opening. The bottom gate electrode 12B and the top gate electrode 14B are electrically connected to each other via the opening.

A diffusion layer 16B is formed on the memory cell side of select transistor STD, and a diffusion layer 16D is formed on the opposite side. The diffusion layer 16B is formed on the memory cell side of select transistor STS, and a diffusion layer 16S is formed on the opposite side.

The diffusion layers 16B, 16D, and 16S function as source/drain regions of select transistors STD and STS. Select transistors STD and STS share the diffusion layer 16B with the adjacent memory cells MC. As a result, the memory cells MC and select transistors STD and STS are connected in series in the element region AA, and the NAND cell unit is formed.

Select transistor STD is located on the drain side of the NAND cell unit. The diffusion layer 16D of select transistor STD is connected to the bit-line contact BC formed in an interlayer insulating film 17. The bit-line contact BC is connected to a bit line BL via a metal interconnect M0 and a via contact VC disposed in an interlayer insulating film 18.

Select transistor STS is located on the source side of the NAND cell unit. The diffusion layer 16S of select transistor STS is connected to a source line SL via the source-line contact SC formed in the interlayer insulating film 17.

According to the first embodiment, intergate insulating film 13T is formed on the upper surface of the floating gate electrode 12A. In this intergate insulating film 13T, the bottom silicon nitride film 13A, the bottom silicon oxide film 13B, the insulating film (for example, center silicon nitride film) 13C, the top silicon oxide film 13D, and the top silicon nitride film 13E are stacked in this order. Intergate insulating film 13S is formed on the on the side surface of the floating gate electrode 12A. In intergate insulating film 13S, the bottom silicon nitride film 13A, the top silicon oxide film 13D, and the top silicon nitride film 13E are stacked in this order. That is, intergate insulating film 13S on the side surface of the floating gate electrode 12A does not have the insulating film 13C, and intergate insulating film 13T on the upper surface of the floating gate electrode 12A has the insulating film 13C.

As the insulating film 13C is not present on the side surface of the floating gate electrode 12A, it is possible to inhibit the spread of a threshold distribution caused when electrons are trapped by the insulating film 13C on the side surface of the floating gate electrode 12A because of repeated writing and erasing. Moreover, as a result of the elimination of the insulating film 13C on the side surface of the floating gate electrode 12A, the insulating film 13C on the upper surface of the floating gate electrode 12A can be increased in thickness without the side effects of the above-mentioned spread of the threshold distribution, in comparison with the case where the NONON film is formed on the upper surface and side surface of the floating gate electrode. Consequently, a leakage current in the intergate insulating film can be reduced, and write saturation that prevents writing up to a necessary threshold can be improved.

Furthermore, according to the first embodiment, the leakage current in the intergate insulating film can be reduced without the increase in the thickness of the insulating film on the side surface of the floating gate electrode 12A. Thus, the thickness of the intergate insulating film on the side surface of the floating gate electrode 12A can be reduced. As the thickness of the intergate insulating film on the side surface of the floating gate electrode 12A can be reduced, the following advantages are provided.

Firstly, as the thickness of the intergate insulating film on the side surface of the floating gate electrode can be reduced, a coupling ratio between the floating gate electrode 12A and the control gate electrode 14A can be increased. Secondly, the distance between the floating gate electrodes 12A to embed the control gate electrode 14A can be increased, and the control gate electrode 14A can therefore be easily embedded between the floating gate electrodes 12A. Thirdly, as the distance between the floating gate electrodes 12A to embed the control gate electrode 14A can be increased, the volume of the control gate electrode 14A can be increased, and the depletion of the control gate electrode 14A can be inhibited. Fourthly, as the thickness of the intergate insulating film can be reduced, the floating gate electrode 12A can be reduced in thickness while the coupling ratio between the floating gate electrode 12A and the control gate electrode 14A is maintained.

As described above, according to the present embodiment, as the intergate insulating film disposed between the floating gate electrode and the control gate electrode, the insulating film 13C is formed on the upper surface of the floating gate electrode 12A without the insulating film 13C disposed on the side surface of the floating gate electrode 12A. Consequently, the spread of the threshold distribution of the memory cell resulting from repeated writing and erasing can be inhibited, and the leakage current in the intergate insulating film can be reduced.

[2] Method of Manufacturing Memory Cell Array

Now, a method of manufacturing the NAND flash memory according to the first embodiment is described. FIG. 4 to FIG. 9 are sectional views showing the method of manufacturing the memory cell array in the NAND flash memory according to the first embodiment.

Figure 4:
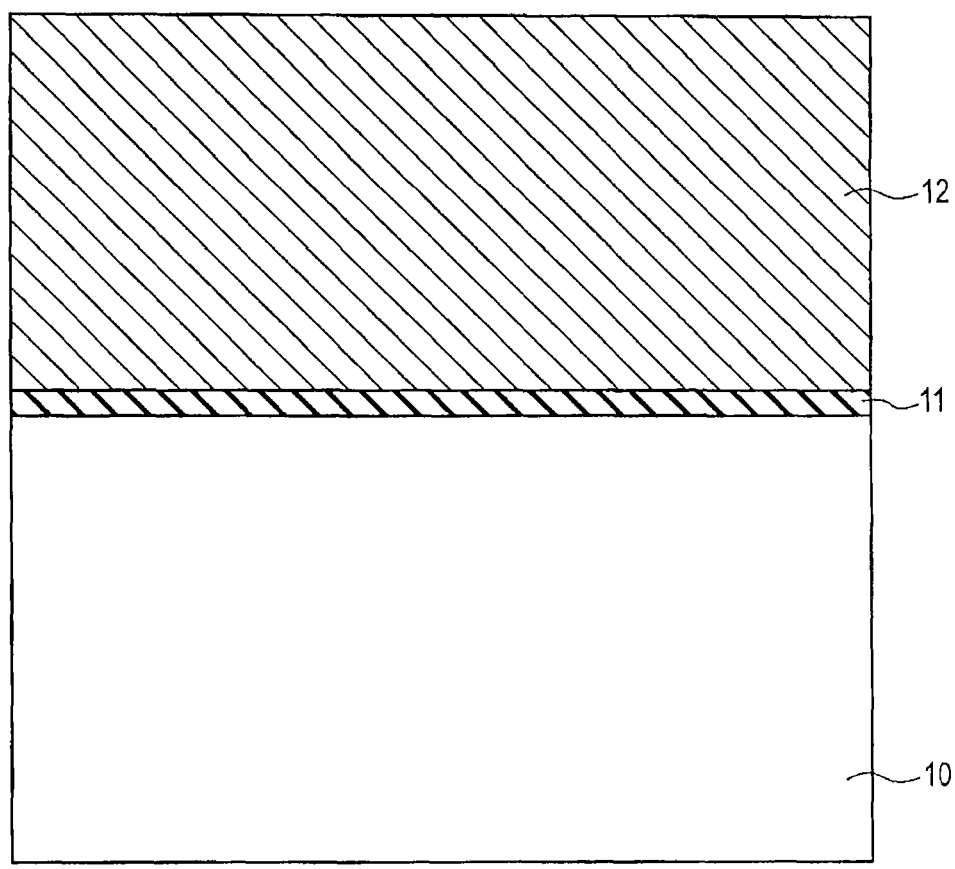

First, as shown in FIG. 4, a film 11 to be a gate insulating film is formed on a semiconductor substrate 10, and a film 12 to be a floating gate electrode is formed on the film 11. For example, the film 11 is made of a silicon oxide film, and the film 12 is made of a polysilicon film.

As shown in FIG. 5, the surface of the film 12 is then nitrided to form a silicon nitride film 13A on the film 12. Further, a silicon oxide film 13B and a silicon nitride film 13C are formed on the silicon nitride film 13A in order.

The silicon nitride film 13C, the silicon oxide film 13B, the silicon nitride film 13A, the film 12, the film 11, and the surface region of the semiconductor substrate 10 are then etched to isolate these films for each memory cell. Further, an insulating film (element isolation region) is embedded in the gaps between the element regions AA and the floating gate electrodes 12A. The element isolation region is made of, for example, a silicon oxide film.

As shown in FIG. 6, an element isolation region 15 is then etched back and thereby set back. As a result, the side surface of the floating gate electrode 12A is exposed, and the silicon nitride film 13C, the silicon oxide film 13B, and the silicon nitride film 13A are left on the upper surface of the floating gate electrode 12A.

Figure 7:
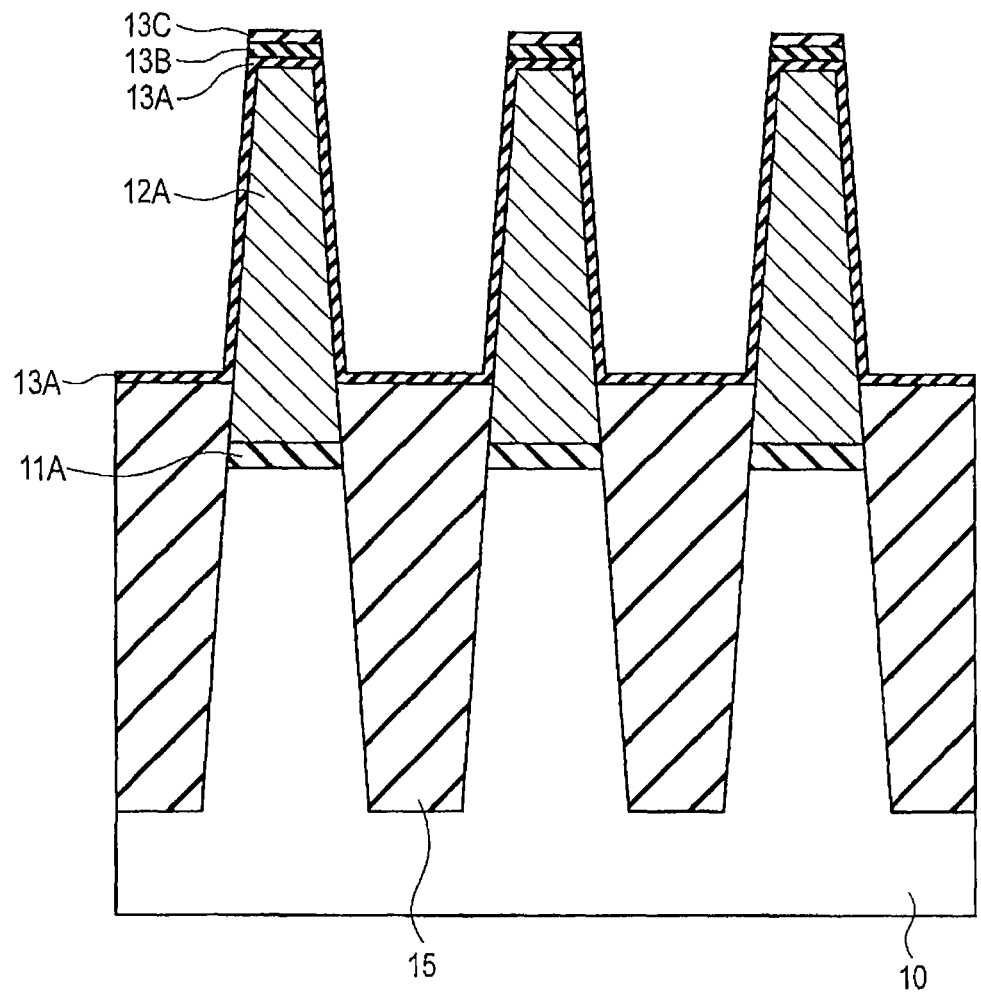

The side surface of the floating gate electrode 12A and the surface of the element isolation region 15 are then nitrided to form the silicon nitride film 13A on the side surface of the floating gate electrode 12A and the upper surface of the element isolation region 15, as shown in FIG. 7.

As shown in FIG. 8, a silicon oxide film 13D is then formed on the silicon nitride film 13C on the upper surface of the floating gate electrode 12A, on the side surface of the floating gate electrode 12A, and on the element isolation region 15. That is, the silicon oxide film 13D is formed on the silicon nitride films 13A and 13C.

Figure 9:
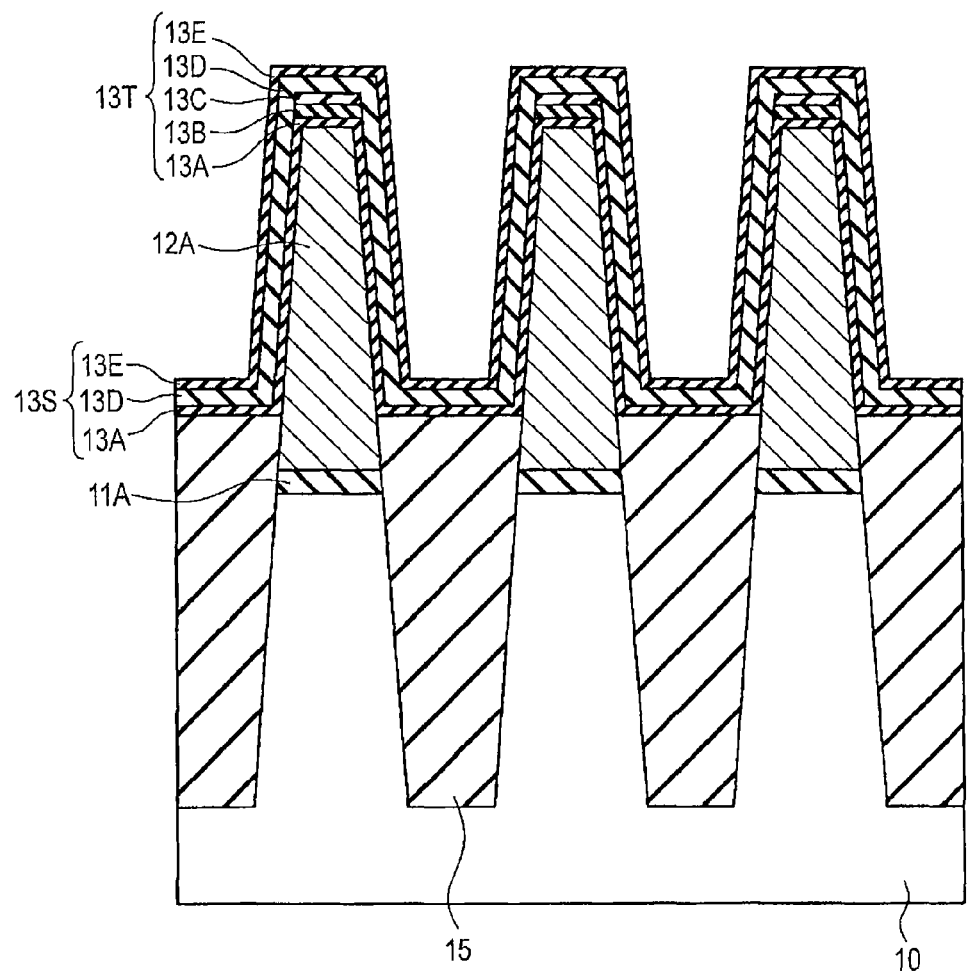

As shown in FIG. 9, the surface of the silicon oxide film 13D is then nitrided to form a silicon nitride film 13E on the silicon oxide film 13D. As a result, an intergate insulating film 13T in which the bottom silicon nitride film 13A, the bottom silicon oxide film 13B, the center silicon nitride film 13C, the top silicon oxide film 13D, and the top silicon nitride film 13E are stacked in this order is formed on the upper surface of the floating gate electrode 12A. Moreover, an intergate insulating film 13S in which the bottom silicon nitride film 13A, the top silicon oxide film 13D, and the top silicon nitride film 13E are stacked in this order is formed on the side surface of the floating gate electrode 12A.

On the structure shown in FIG. 9, that is, on the silicon nitride film 13E, a control gate electrode 14A is then formed, as shown in FIG. 3. Consequently, the NAND flash memory according to the first embodiment is manufactured.

Second Embodiment

In an example described in the second embodiment, a three-layer structure (ONO film) is formed between the upper surface of a floating gate electrode and a control gate electrode, and a single-layer structure (O film) is formed between the side surface of the floating gate electrode and the control gate electrode.

[1] Configuration of Memory Cell Array

Figure 10:
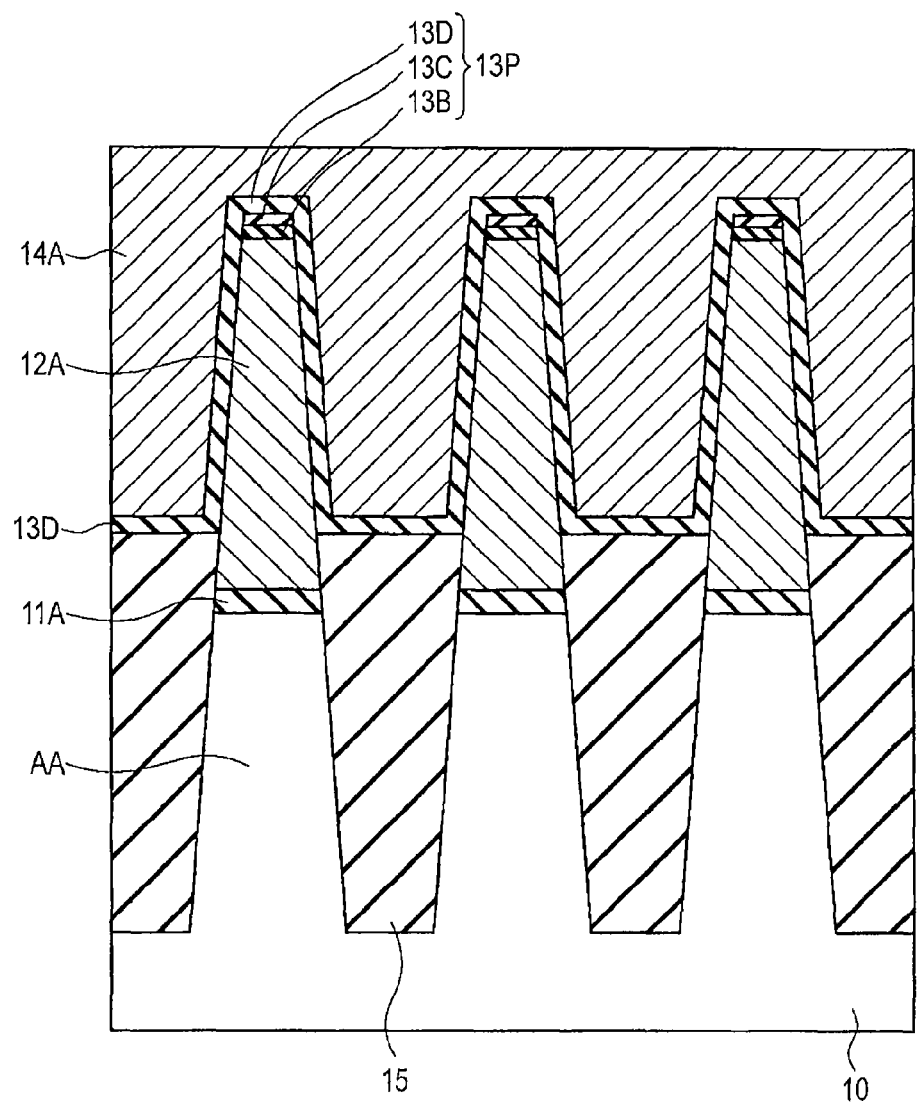

FIG. 10 is a sectional view showing the configuration of a memory cell array in a NAND flash memory according to the second embodiment.

An element isolation region 15, and element regions AA isolated by the element isolation region 15 are arranged in the surface region of a semiconductor substrate 10. A memory cell MC is disposed on the semiconductor substrate (element region AA) 10. In the memory cell MC, a gate insulating film (tunnel insulating film) 11A, a floating gate electrode 12A, an intergate insulating film 13P, and a control gate electrode 14A are stacked in this order.

Intergate insulating film 13P is formed on the upper surface of the floating gate electrode 12A. Intergate insulating film 13P has a stack film (what is known as an ONO film) in which a bottom silicon oxide film 13B, an insulating film (for example, center silicon nitride film) 13C, and a top silicon oxide film 13D are stacked in this order from the side of the floating gate electrode 12A. The silicon oxide film 13D is formed on the side surface of the floating gate electrode 12A. The configuration is similar in other respects to that according to the first embodiment.

According to the second embodiment, intergate insulating film 13P in which the bottom silicon oxide film 13B, the insulating film (for example, center silicon nitride film) 13C, and the top silicon oxide film 13D are stacked in this order is formed on the upper surface of the floating gate electrode 12A. The top silicon oxide film 13D is formed on the side surface of the floating gate electrode 12A. That is, the intergate insulating film on the side surface of the floating gate electrode 12A does not have the insulating film 13C, and intergate insulating film 13P on the upper surface of the floating gate electrode 12A has the insulating film 13C.

As the insulating film 13C is not present on the side surface of the floating gate electrode 12A, it is possible to inhibit the spread of a threshold distribution caused when electrons are trapped by the insulating film 13C on the side surface of the floating gate electrode 12A because of repeated writing and erasing. Moreover, as a result of the elimination of the insulating film 13C on the side surface of the floating gate electrode 12A, the insulating film 13C on the upper surface of the floating gate electrode 12A can be increased in thickness without the side effects of the above-mentioned spread of the threshold distribution, in comparison with the case where a NONON film is formed on the upper surface and side surface of the floating gate electrode. Consequently, a leakage current in the intergate insulating film can be reduced, and write saturation that prevents writing up to a necessary threshold can be improved.

As described above, according to the present embodiment, as the intergate insulating film disposed between the floating gate electrode and the control gate electrode, the insulating film 13C is disposed on the upper surface of the floating gate electrode 12A without the insulating film 13C disposed on the side surface of the floating gate electrode 12A. Consequently, the spread of the threshold distribution of the memory cell resulting from repeated writing and erasing can be inhibited, and the leakage current in the intergate insulating film can be reduced.

[2] Method of Manufacturing Memory Cell Array

Now, a method of manufacturing the NAND flash memory according to the second embodiment is described. FIG. 11 to FIG. 14 are sectional views showing the method of manufacturing the memory cell array in the NAND flash memory according to the second embodiment.

Figure 11:
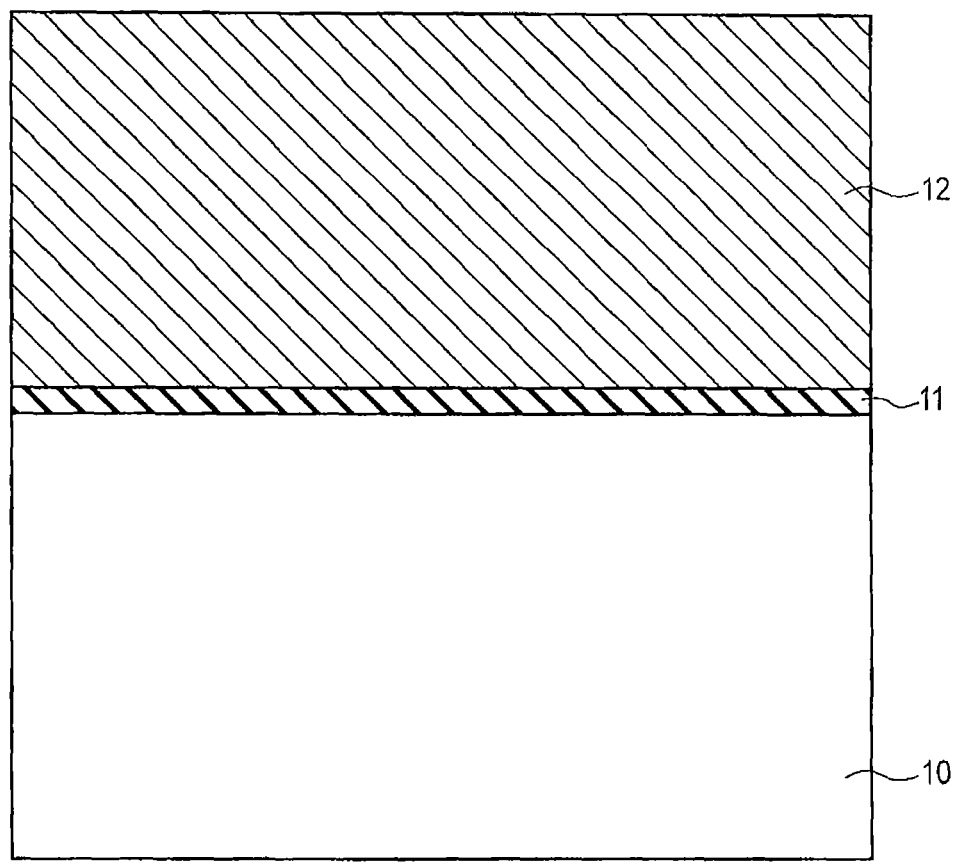

As in the first embodiment, first, as shown in FIG. 11, a film 11 to be a gate insulating film is formed on a semiconductor substrate 10, and a film 12 to be a floating gate electrode is formed on the film 11. For example, the film 11 is made of a silicon oxide film, and the film 12 is made of a polysilicon film.

As shown in FIG. 12, a silicon oxide film 13B and a silicon nitride film 13C are then formed on the film 12 in order. The silicon nitride film 13C, the silicon oxide film 13B, the film 12, the film 11, and the surface region of the semiconductor substrate 10 are then etched to isolate these films for each memory cell. Further, an insulating film (element isolation region) is embedded in the gaps between the element regions AA and between the floating gate electrodes 12A. The element isolation region is made of, for example, a silicon oxide film.

As shown in FIG. 13, an element isolation region 15 is then etched back and thereby set back. As a result, the side surface of the floating gate electrode 12A is exposed, and the silicon oxide film 13B and the silicon nitride film 13C are left on the upper surface of the floating gate electrode 12A.

Figure 14:
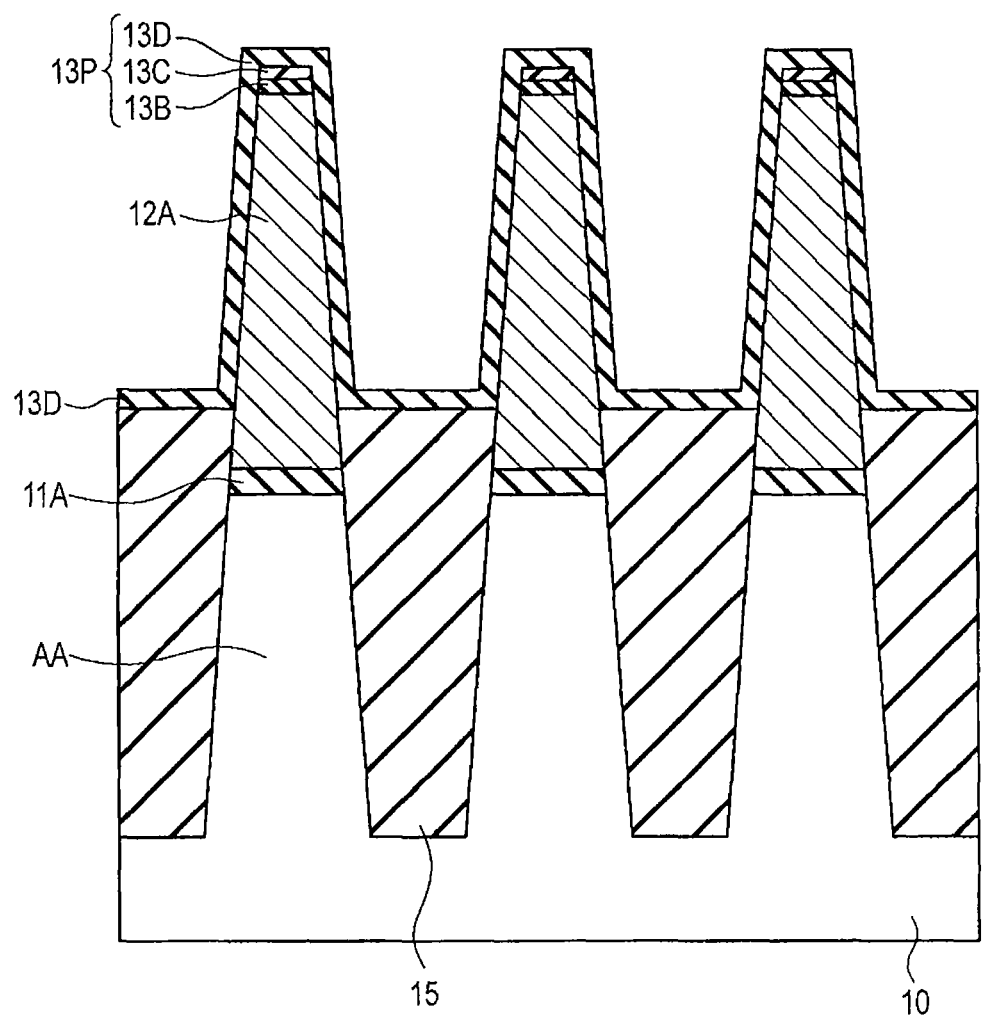

As shown in FIG. 14, a silicon oxide film 13D is formed on the silicon nitride film 13C on the upper surface of the floating gate electrode 12A, on the side surface of the floating gate electrode 12A, and on the element isolation region 15. As a result, an intergate insulating film 13P in which the bottom silicon oxide film 13B, the center silicon nitride film 13C, and the top silicon oxide film 13D are stacked in this order is formed on the upper surface of the floating gate electrode 12A. Moreover, a single-layer intergate insulating film including the top silicon oxide film 13D is formed on the side surface of the floating gate electrode 12A.

On the structure shown in FIG. 14, that is, on the silicon oxide film 13D, a control gate electrode 14A is then formed, as shown in FIG. 10. The process is similar in other respects to that according to the first embodiment. Consequently, the NAND flash memory according to the second embodiment is manufactured.

Third Embodiment

In an example described in the third embodiment, an intergate insulating film having a four-layer structure (NONO film) is formed on the upper surface of a floating gate electrode, and an intergate insulating film having a five-layer structure (NONON film) is formed on the side surface of the floating gate electrode.

[1] Configuration of Memory Cell Array

Figure 15:
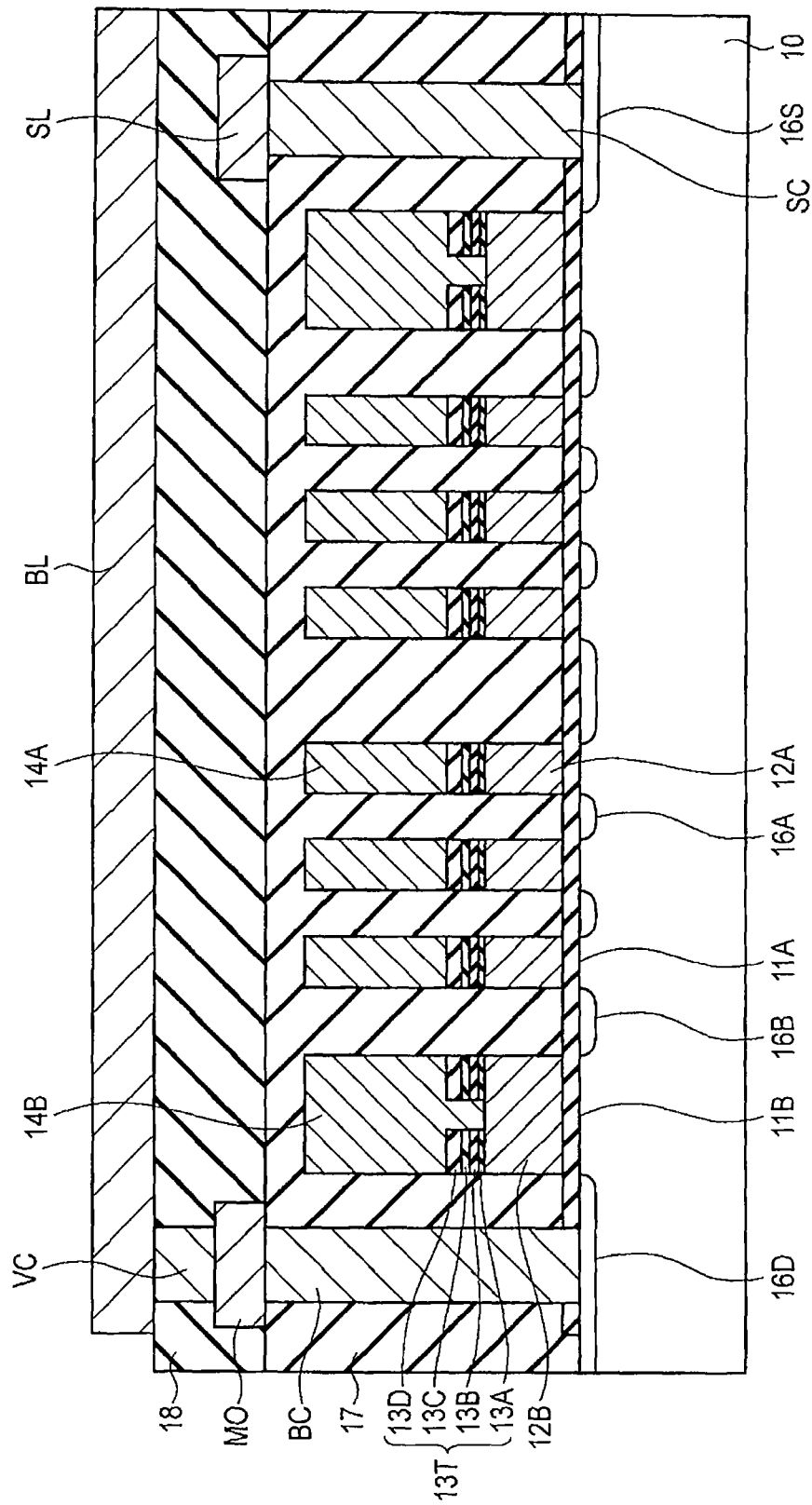
FIGS. 15 and 16 are sectional views showing the configuration of a nonvolatile semiconductor memory device according to a third embodiment.
Figure 16:
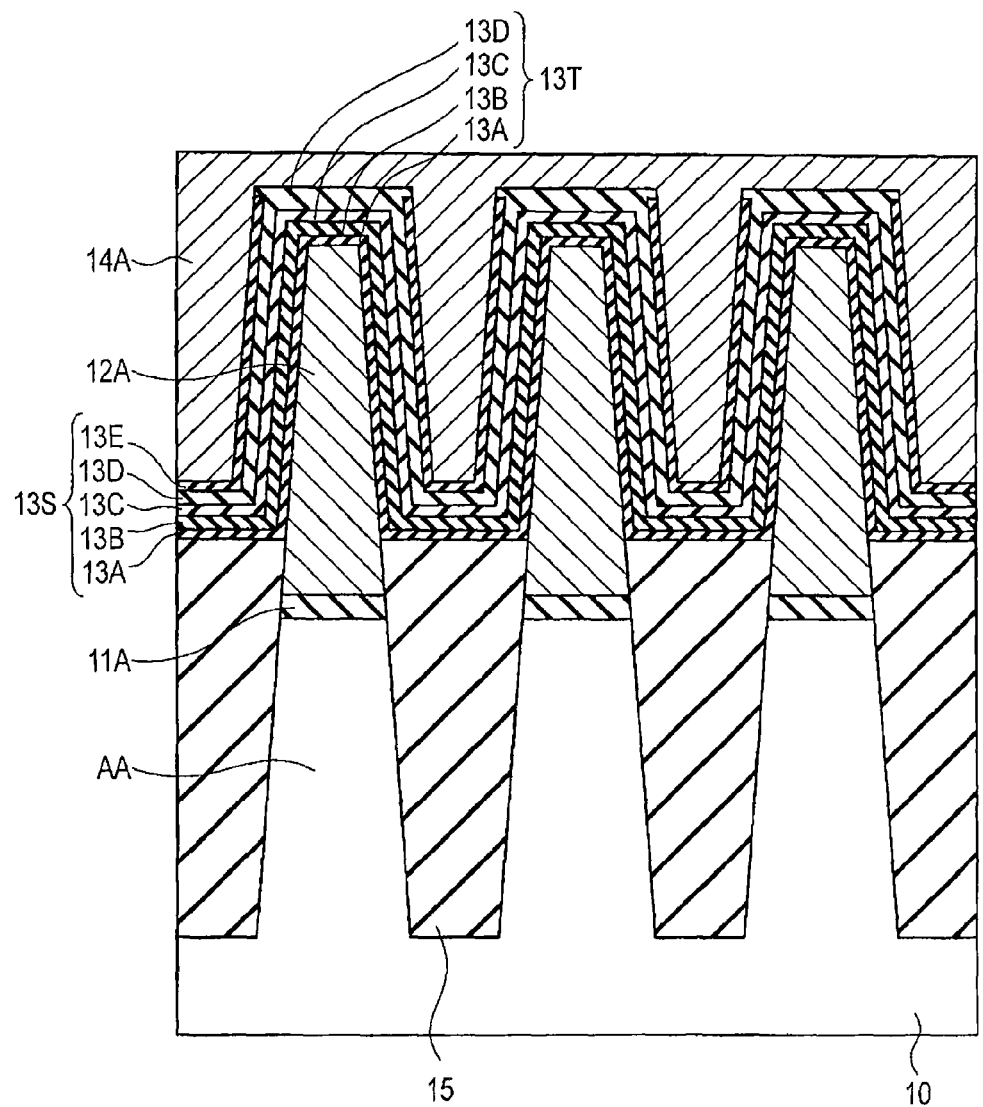

FIG. 15 and FIG. 16 are sectional views of a memory cell array in a NAND flash memory according to the third embodiment. FIG. 15 shows a section along the channel length direction (bit-line direction) of a memory cell MC. FIG. 16 shows a section along the channel width direction (word-line direction) of the memory cell MC.

As shown in FIG. 15 and FIG. 16, an intergate insulating film 13T is formed on the upper surface of a floating gate electrode 12A, and an intergate insulating film 13S is formed on the side surface of the floating gate electrode 12A and on an element isolation region 15.

Intergate insulating film 13T formed on the upper surface of the floating gate electrode 12A has a stack film (what is known as a NONO film) in which a bottom silicon nitride film 13A, a bottom silicon oxide film 13B, an insulating film (for example, center silicon nitride film) 13C, and a top silicon oxide film 13D are stacked in this order from the side of the floating gate electrode 12A. The symbol "N" denotes a silicon nitride film, and the symbol "O" denotes a silicon oxide film.

Intergate insulating film 13S formed on the side surface of the floating gate electrode 12A and on the element isolation region 15 has a stack film (what is known as a NONON film) in which a bottom silicon nitride film 13A, a bottom silicon oxide film 13B, an insulating film (for example, center silicon nitride film) 13C, a top silicon oxide film 13D, and a top silicon nitride film 13E are stacked in this order from the side of the floating gate electrode 12A and the element isolation region 15.

The silicon oxide film 13D on the upper surface of the floating gate electrode 12A is thicker than the silicon oxide film 13D on the side surface of the floating gate electrode 12A and on the element isolation region 15.

The materials used for intergate insulating films 13T and 13S are not limited to the above-mentioned materials, and other materials may be used instead. A silicon oxynitride (SiON) film or a metal oxide film may be used for the insulating film 13C instead of an insulating (high-k) film such as the above-mentioned silicon nitride (SiN) film having a dielectric constant higher than that of the silicon oxide film. The metal oxide film includes, for example, aluminum oxide ($Al_2O_3$), hafnium oxide ($HfO_2$), yttrium oxide ($Y_2O_3$), lanthanum oxide ($La_2O_3$), lanthanum aluminate ($LaAlO_3$), hafnium aluminate (HfAlOx), tantalum oxide ($Ta_2O_5$), and titanium oxide ($TiO_2$). These materials are not limited to the composition ratios in parentheses.

Intergate insulating film 13T has a four-layer structure (NONO film) on the upper surface of the floating gate electrode 12A, and intergate insulating film 13S has a five-layer structure (NONON film) on the side surface of the floating gate electrode 12A and on the element isolation region 15. However, these intergate insulating films are not limited to such structures. For example, a three-layer structure (ONO film) may be provided on the upper surface of the floating gate electrode 12A, and a four-layer structure (ONON film) may be provided on the side surface of the floating gate electrode 12A and on the element isolation region 15. Other multilayer structures may be provided.

The control gate electrode 14A is formed on intergate insulating films 13T and 13S. That is, the control gate electrode 14A is formed on the upper surface and side surface of the floating gate electrode 12A via intergate insulating films 13T and 13S, respectively. The control gate electrode 14A is equivalent to a word line WL.

For example, a silicide film is used for the control gate electrode 14A to reduce electric resistance. However, the control gate electrode 14A is not limited to the silicide film, and may have a single-layer structure of a polysilicon film or a double-layer structure (polycide structure) in which a polysilicon film and a silicide film are stacked. As the silicide film, for example, a tungsten silicide film, a molybdenum silicide film, a cobalt silicide film, a titanium silicide film, or a nickel silicide film is used.

The control gate electrode 14A functions as a word line, and is shared between the adjacent memory cells MC. Therefore, the control gate electrode 14A is formed not only on the floating gate electrode 12A but also on the element isolation region 15. The configuration is similar in other respects to that according to the first embodiment.

According to the third embodiment, intergate insulating film 13T is formed on the upper surface of the floating gate electrode 12A. In this intergate insulating film 13T, the bottom silicon nitride film 13A, the bottom silicon oxide film 13B, the insulating film (for example, center silicon nitride film) 13C, and the top silicon oxide film 13D are stacked in this order. Intergate insulating film 13S is formed on the side surface of the floating gate electrode 12A. In intergate insulating film 13S, the bottom silicon nitride film 13A, the bottom silicon oxide film 13B, the insulating film 13C, the top silicon oxide film 13D, and the top silicon nitride film 13E are stacked in this order. The top silicon oxide film 13D on the upper surface of the floating gate electrode 12A is thicker than the top silicon oxide film 13D on the side surface of the floating gate electrode 12A. Consequently, in the memory cell according to the third embodiment, a leakage current in the intergate insulating film can be reduced, and write saturation that prevents writing up to a necessary threshold can be improved.

Figure 17A:
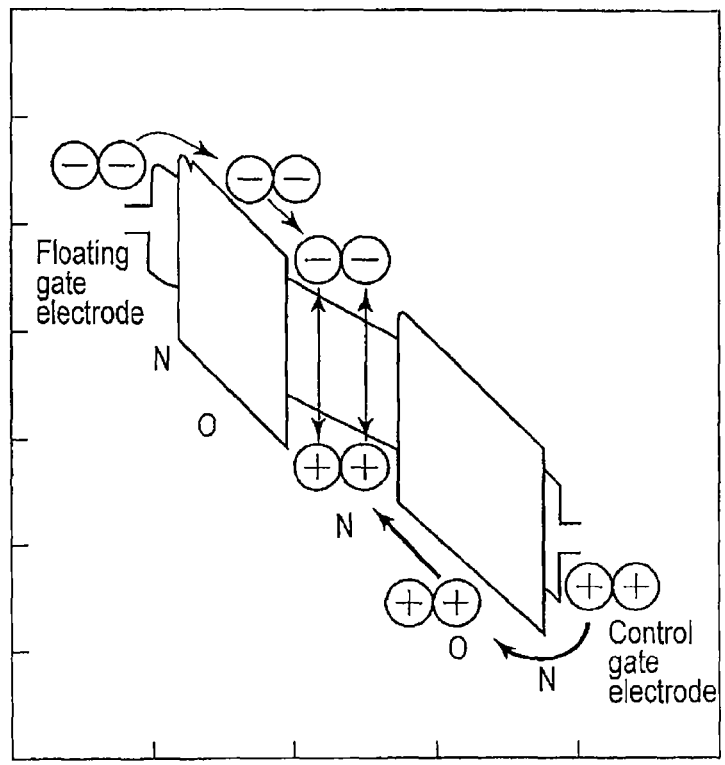
FIG. 17A is a graph of an energy band in an intergate insulating (NONON) film between a floating gate electrode and a control gate electrode.

The leakage current can be reduced and the write saturation can be improved for the following reasons. For example, when the intergate insulating film which is in contact with the control gate electrode is a silicon nitride film, holes tend to be injected into the center silicon nitride film from the control gate electrode because the barrier against holes is lower in the silicon nitride film than in a silicon oxide film. FIG. 17A shows an energy band graph when the intergate insulating film is a NONON film. As apparent from FIG. 17A, the amount of holes injected into the center silicon nitride film from the control gate electrode is great because the NONON film has a low barrier against holes. Thus, electrons trapped by the center silicon nitride film are recombined with the holes, so that the trapped electrons in the center silicon nitride film are reduced, and the leakage current in the intergate insulating film more easily runs.

Figure 17B:
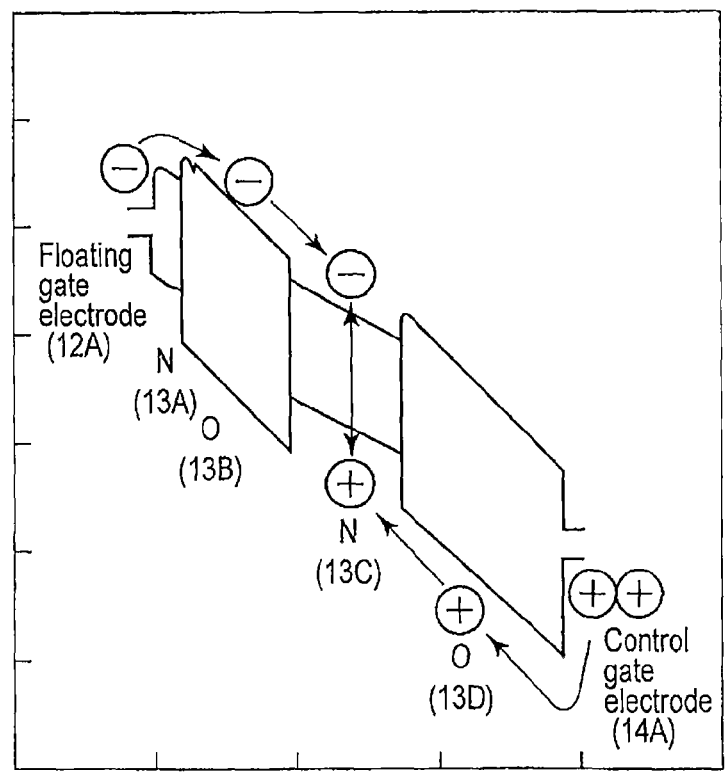
FIG. 17B is a graph of an energy band in an intergate insulating (NONO) film between the floating gate electrode and the control gate electrode according to the third embodiment.
Figure 18:
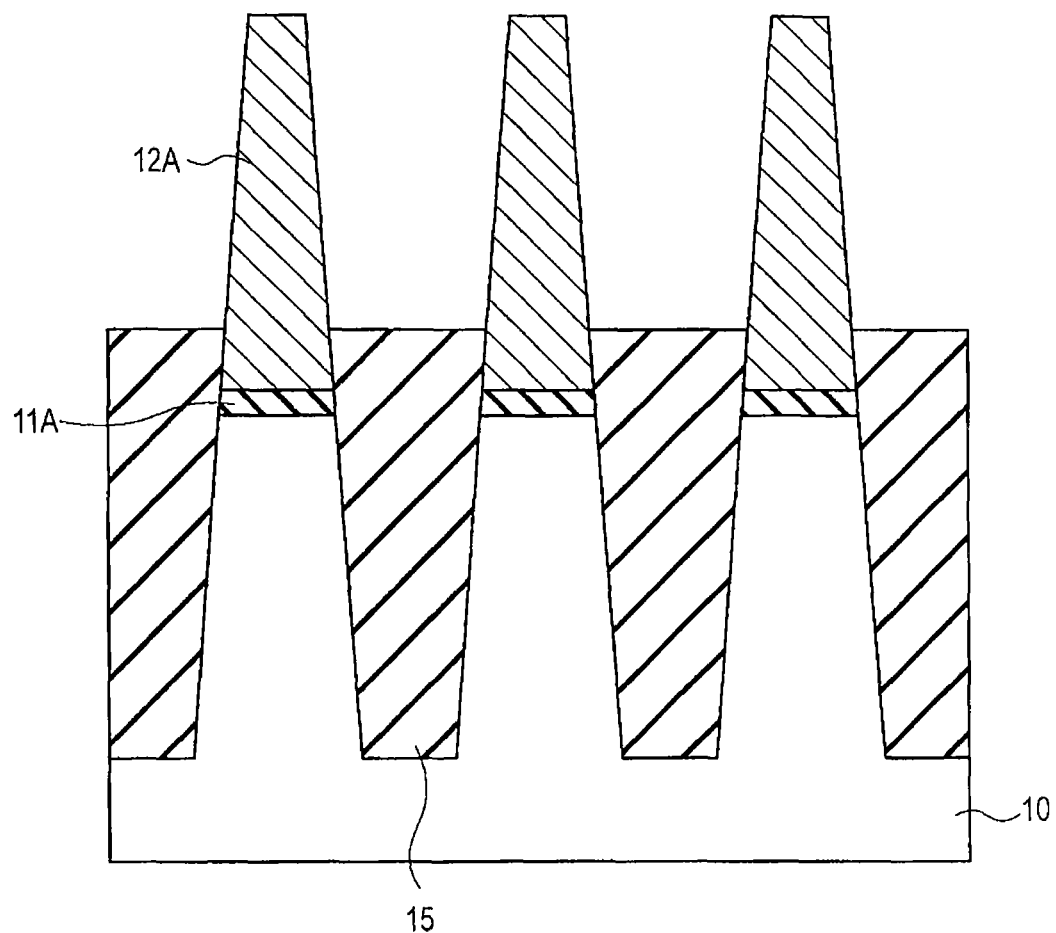
Figure 19:
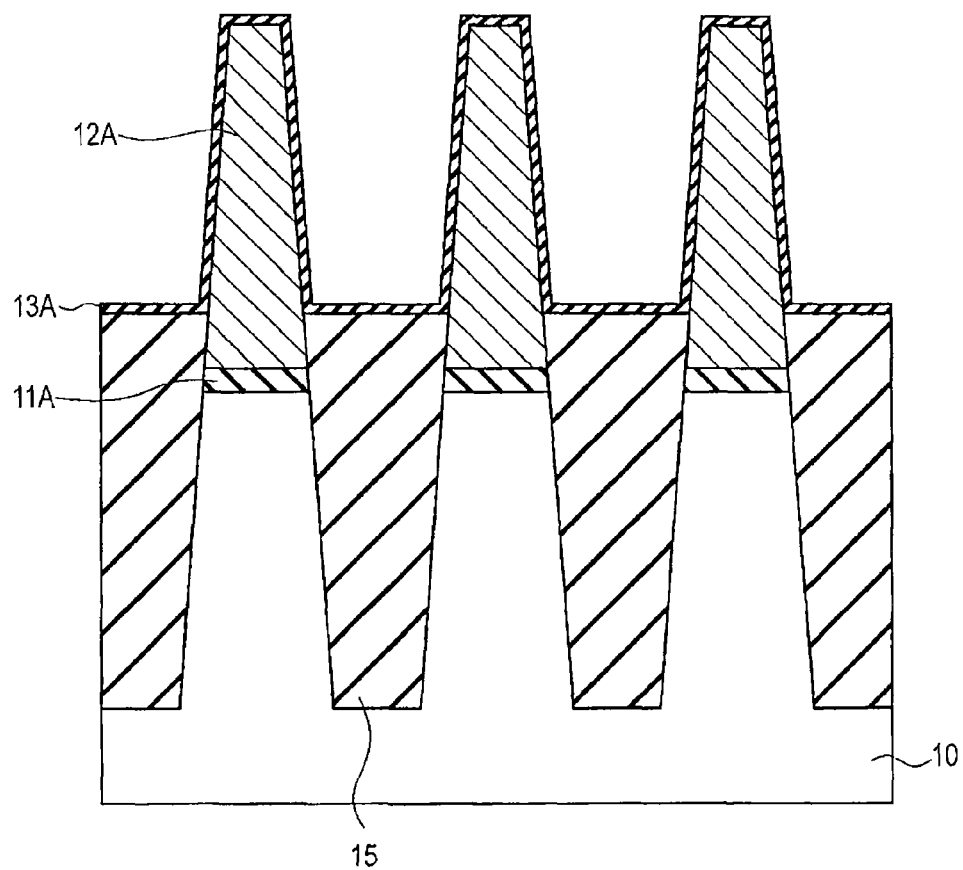

On the other hand, as in the present embodiment, when the intergate insulating film which is in contact with the control gate electrode 14A is the top silicon oxide film 13D instead of the silicon nitride film, the barrier against holes is higher, and the injection of holes from the control gate electrode 14A is reduced. FIG. 17B shows an energy band graph when the intergate insulating film is a NONO film. As apparent from FIG. 17B, in this case, the injection of holes is less, and the recombination of the trapped electrons in the insulating film 13C and the holes is also less. Thus, in comparison with the NONON film, the NONO film can reduce the leakage current in the intergate insulating film because the amount of trapped electrons in the insulating film 13C is greater.

Here, a high leakage current is generated in the vicinity of the upper surface of the floating gate electrode 12A by the concentration of an electric field. Therefore, the top silicon oxide film 13D is used on the upper surface of the floating gate electrode 12A instead of the silicon nitride film, and the thickness of the top silicon oxide film 13D is increased. This allows a considerable reduction of the leakage current in intergate insulating film 13T.

Furthermore, according to the third embodiment, the intergate insulating (NONON) film in which the bottom silicon nitride film 13A, the bottom silicon oxide film 13B, the insulating film (for example, center silicon nitride film) 13C, the top silicon oxide film 13D, and the top silicon nitride film 13E are stacked in this order is formed on the side surface of the floating gate electrode 12A. It is thereby possible to inhibit the phenomenon in which the threshold distribution of each of multiple values in the memory cell spreads when writing and erasing are repeated.

The phenomenon of the spread of the threshold distribution of the memory cell can be inhibited for the following reasons. For example, when the intergate insulating film which is in contact with the control gate electrode 14A on the side surface of the floating gate electrode 12A is a silicon oxide film, electrons trapped by the insulating film 13C do not easily escape toward the control gate electrode 14A. As a result, it is difficult to inhibit the phenomenon in which the threshold distribution of each of multiple values in the memory cell spreads.

On the other hand, as in the present embodiment, when intergate insulating film 13S which is in contact with the control gate electrode 14A on the side surface of the floating gate electrode 12A is the top silicon nitride film 13E, the electrons trapped by the insulating film 13C easily escape toward the control gate electrode 14A via the top silicon nitride film 13E. As a result, it is possible to inhibit the phenomenon in which the threshold distribution of each of multiple values spreads.

Furthermore, according to the third embodiment, the leakage current in the intergate insulating film can be reduced, so that the thickness of the intergate insulating film can be reduced. As the thickness of the intergate insulating film can be reduced, the following advantages are provided.

Firstly, as the thickness of the intergate insulating film can be reduced, a coupling ratio between the floating gate electrode 12A and the control gate electrode 14A can be increased. Secondly, the distance between the floating gate electrodes 12A to embed the control gate electrode 14A can be increased, and the control gate electrode 14A can therefore be easily embedded between the floating gate electrodes 12A. Thirdly, as the distance between the floating gate electrodes 12A to embed the control gate electrode 14A can be increased, the volume of the control gate electrode 14A can be increased, and the depletion of the control gate electrode 14A can be inhibited. Fourthly, as the thickness of the intergate insulating film can be reduced, the floating gate electrode 12A can be reduced in thickness while the coupling ratio between the floating gate electrode 12A and the control gate electrode 14A is maintained.

As described above, according to the present embodiment, the intergate insulating film which is in contact with the control gate electrode on the upper surface of the floating gate electrode is a silicon oxide film. The thickness of this film is larger than the thickness of the silicon oxide film on the side surface of the floating gate electrode. Consequently, the leakage current in the intergate insulating film can be reduced.

Moreover, as the intergate insulating film disposed between the floating gate electrode and the control gate electrode, the NONO film is disposed on the upper surface of the floating gate electrode, and the NONON film is disposed on the side surface of the floating gate electrode. Consequently, the leakage current in the intergate insulating film can be reduced without deterioration of the threshold distribution of the memory cell.

[2] Method of Manufacturing Memory Cell Array

Now, a method of manufacturing the NAND flash memory according to the third embodiment is described. FIG. 18 to FIG. 22 are sectional views showing the method of manufacturing the memory cell array in the NAND flash memory according to the third embodiment.

A gate insulating film and a floating gate electrode are formed on a semiconductor substrate, and then an insulating film (element isolation region) is embedded between element regions AA and between the floating gate electrodes. For example, the gate insulating film and the element isolation region are made of silicon oxide films, and the floating gate electrode is made of a polysilicon film.

In the structure described above, first, as shown in FIG. 18, an element isolation region 15 is etched back and thereby set back. As a result, the upper surface and side surface of the floating gate electrode 12A are exposed.

The upper surface and side surface of the floating gate electrode 12A and the surface of the element isolation region 15 are then nitrided to form a silicon nitride film 13A on the upper surface and side surface of the floating gate electrode 12A and on the upper surface of the element isolation region 15.

Figure 21:
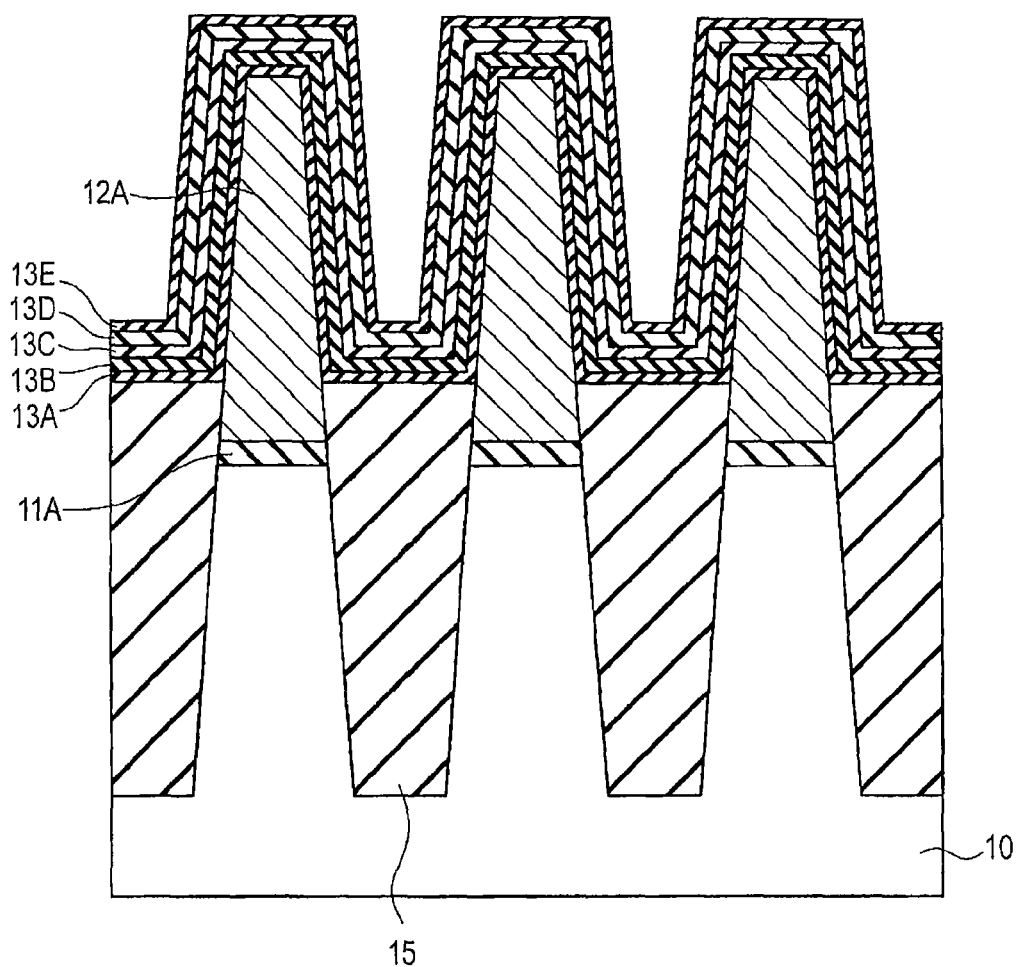

As shown in FIG. 20, a silicon oxide film 13B, a silicon nitride film 13C, and a silicon oxide film 13D are then formed on the silicon nitride film 13A in this order. Further, as shown in FIG. 21, the surface of the silicon oxide film 13D is nitrided to form a silicon nitride film 13E on the silicon oxide film 13D.

Figure 22:
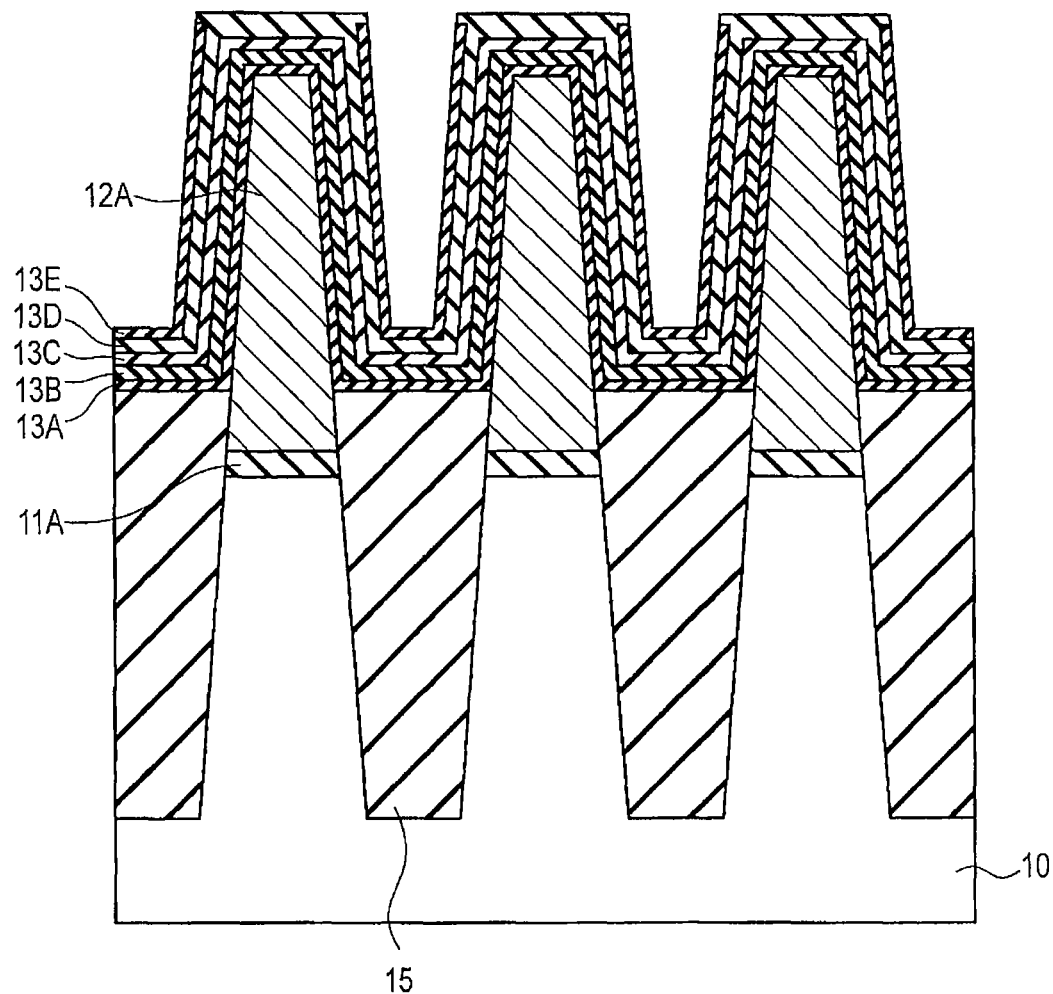

The silicon nitride film 13E on the upper surface of the floating gate electrode 12A is then anisotropically oxidized, and as shown in FIG. 22, the silicon nitride film 13E on the upper surface of the floating gate electrode 12A is oxidized and thus transformed into a silicon oxide film. As a result, the silicon oxide film 13D disposed on the silicon nitride film 13C on the upper surface of the floating gate electrode 12A is thicker than the silicon oxide film 13D on the silicon nitride film 13C on the side surface of the floating gate electrode 12A. The anisotropic oxidation only oxidizes the upper surface of the floating gate electrode 12A by plasma oxidation or by oxygen (O) ion implantation and does not oxidize its side surface.

As shown in FIG. 16, a control gate electrode 14A is then formed on the structure shown in FIG. 22, that is, on the silicon oxide film 13D on the upper surface of the floating gate electrode 12A, and on the silicon nitride film 13E on the side surface of the floating gate electrode 12A and on the element isolation region 15. Consequently, the NAND flash memory according to the third embodiment is manufactured.

As described above, the following process is used in the manufacturing method according to the present embodiment. As shown in FIG. 21, the NONON film is formed on the upper surface and side surface of the floating gate electrode 12A. The uppermost silicon nitride film 13E on the upper surface of the floating gate electrode 12A is then anisotropically oxidized and thus transformed into a silicon oxide film. As a result, the uppermost silicon oxide film on the upper surface of the floating gate electrode 12A can be thicker than the uppermost silicon oxide film on the side surface of the floating gate electrode 12A.

Fourth Embodiment

In an example described in the fourth embodiment, an intergate insulating film having a three-layer structure (ONO film) is formed between a floating gate electrode and a control gate electrode.

[1] Configuration of Memory Cell Array

FIG. 23 is a sectional view showing the configuration of a memory cell array in a NAND flash memory according to the fourth embodiment.

An element isolation region 15, and element regions AA isolated by the element isolation region 15 are arranged in the surface region of a semiconductor substrate 10. A memory cell MC is disposed on the semiconductor substrate (element region AA) 10. In the memory cell MC, a gate insulating film (tunnel insulating film) 11A, a floating gate electrode 12A, an intergate insulating film 13F, and a control gate electrode 14A are stacked in this order.

Intergate insulating film 13F is formed on the upper surface and side surface of the floating gate electrode 12A and on the element isolation region 15.

Intergate insulating film 13F has a stack film (what is known as an ONO film) in which a bottom silicon oxide film 13B, an insulating film (for example, center silicon nitride film) 13C, and a top silicon oxide film 13D are stacked in this order from the side of the floating gate electrode 12A and the element isolation region 15. The silicon oxide film 13D on the upper surface of the floating gate electrode 12A is thicker than the silicon oxide film 13D on the side surface of the floating gate electrode 12A and on the element isolation region 15. The configuration is similar in other respects to that according to the third embodiment.

According to the fourth embodiment, intergate insulating film 13F is formed on the upper surface and side surface of the floating gate electrode 12A. In this intergate insulating film 13F, the bottom silicon oxide film 13B, the center silicon nitride film 13C, and the top silicon oxide film 13D are stacked in this order. The top silicon oxide film 13D on the upper surface of the floating gate electrode 12A is thicker than the top silicon oxide film 13D on the side surface of the floating gate electrode 12A. Consequently, in the memory cell according to the fourth embodiment, a leakage current in intergate insulating film 13F can be reduced, and write saturation that prevents writing up to a necessary threshold can be improved.

As described above, according to the present embodiment, the intergate insulating film which is in contact with the control gate electrode on the upper surface of the floating gate electrode is a silicon oxide film. The thickness of this film is larger than the thickness of the silicon oxide film on the side surface of the floating gate electrode. Consequently, the leakage current in the intergate insulating film can be reduced.

[2] Method of Manufacturing Memory Cell Array

Figure 25:
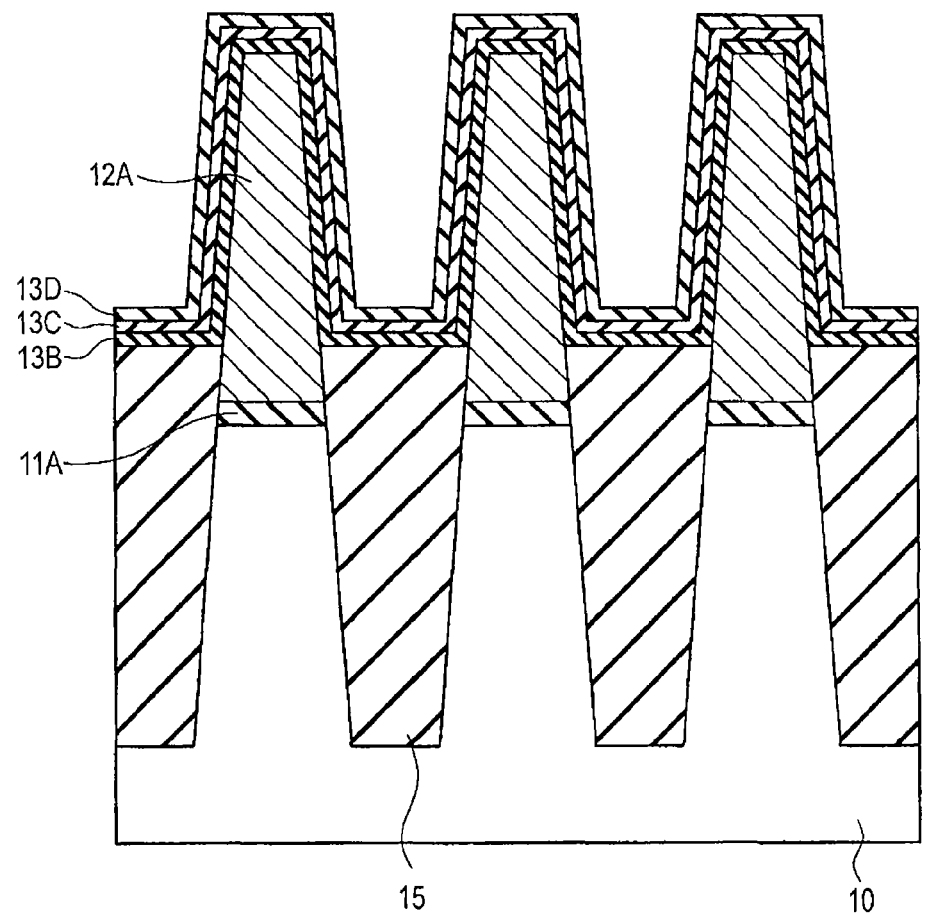

Now, a method of manufacturing the NAND flash memory according to the fourth embodiment is described. FIG. 24 to FIG. 26 are sectional views showing the method of manufacturing the memory cell array in the NAND flash memory according to the fourth embodiment.

As in the third embodiment, first, as shown in FIG. 24, an element isolation region 15 is etched back and thereby set back. As a result, the upper surface and side surface of the floating gate electrode 12A are exposed.

As shown in FIG. 25, a silicon oxide film 13B, a silicon nitride film 13C, and a silicon oxide film 13D are then formed on the upper surface and side surface of the floating gate electrode 12A and on the element isolation region 15 in this order.

The silicon oxide film 13D on the upper surface of the floating gate electrode 12A is then anisotropically oxidized, and as shown in FIG. 26, the silicon oxide film 13D on the upper surface of the floating gate electrode 12A is increased in thickness. As a result, the silicon oxide film 13D disposed on the silicon nitride film 13C on the upper surface of the floating gate electrode 12A is thicker than the silicon oxide film 13D on the silicon nitride film 13C on the side surface of the floating gate electrode 12A. The process is similar in other respects to that according to the third embodiment.

As described above, the following process is used in the manufacturing method according to the present embodiment. As shown in FIG. 25, the ONO film is formed on the upper surface and side surface of the floating gate electrode 12A. The uppermost silicon oxide film 13D on the upper surface of the floating gate electrode 12A is then increased in thickness by the anisotropic oxidation as shown in FIG. 26. As a result, the uppermost silicon oxide film on the upper surface of the floating gate electrode 12A can be thicker than the uppermost silicon oxide film on the side surface of the floating gate electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a gate insulating film formed on a semiconductor substrate;
   a floating gate electrode formed on the gate insulating film;
   a first silicon oxide film formed on an upper surface of the floating gate electrode;
   an insulating film which is formed on the first silicon oxide film on the upper surface of the floating gate electrode without being formed on a side surface of the floating gate electrode and which has a dielectric constant higher than that of the first silicon oxide film;
   a second silicon oxide film formed on the insulating film on the upper surface of the floating gate electrode and on the side surface of the floating gate electrode; and
   a control gate electrode formed on the second silicon oxide film formed on the upper surface and side surface of the floating gate electrode.

2. The nonvolatile semiconductor memory device according to claim 1, further comprising a first silicon nitride film formed on the second silicon oxide film on the upper surface and side surface of the floating gate electrode.

3. The nonvolatile semiconductor memory device according to claim 1, further comprising a second silicon nitride film disposed between the upper surface of the floating gate electrode and the first silicon oxide film and between the side surface of the floating gate electrode and the second silicon oxide film.

4. The nonvolatile semiconductor memory device according to claim 1, wherein the insulating film comprises at least one of a silicon nitride film, a silicon oxynitride film, and a metal oxide film.

5. The nonvolatile semiconductor memory device according to claim 4, wherein the metal oxide film comprises at least one of aluminum oxide, hafnium oxide, yttrium oxide, lanthanum oxide, lanthanum aluminate, hafnium aluminate, tantalum oxide, and titanium oxide.

6. The nonvolatile semiconductor memory device according to claim 1, wherein the control gate electrode comprises a silicide film.

7. The nonvolatile semiconductor memory device according to claim 6, wherein the silicide film comprises at least one of a tungsten silicide film, a molybdenum silicide film, a cobalt silicide film, a titanium silicide film, and a nickel silicide film.

8. The nonvolatile semiconductor memory device according to claim 1, wherein the control gate electrode comprises a polysilicon film.

9. The nonvolatile semiconductor memory device according to claim 1, wherein the control gate electrode comprises a structure in which a polysilicon film and a silicide film are stacked.

10. The nonvolatile semiconductor memory device according to claim 9, wherein the silicide film comprises at least one of a tungsten silicide film, a molybdenum silicide film, a cobalt silicide film, a titanium silicide film, and a nickel silicide film.

11. A nonvolatile semiconductor memory device comprising:
   a gate insulating film formed on a semiconductor substrate;
   a floating gate electrode formed on the gate insulating film;
   a first silicon oxide film formed on an upper surface and side surface of the floating gate electrode;
   an insulating film which is formed on the first silicon oxide film and which has a dielectric constant higher than that of the first silicon oxide film;
   a second silicon oxide film which is formed on the insulating film and which is lager in thickness on the upper surface of the floating gate electrode than on the side surface of the floating gate electrode; and
   a control gate electrode formed on the second silicon oxide film.

12. The nonvolatile semiconductor memory device according to claim 11, further comprising a first silicon nitride film formed on the second silicon oxide film on the side surface of the floating gate electrode.

13. The nonvolatile semiconductor memory device according to claim 11, further comprising a second silicon nitride film disposed between the upper surface and side surface of the floating gate electrode and the first silicon oxide film.

14. The nonvolatile semiconductor memory device according to claim 11, wherein the insulating film comprises at least one of a silicon nitride film, a silicon oxynitride film, and a metal oxide film.

15. The nonvolatile semiconductor memory device according to claim 14, wherein the metal oxide film comprises at least one of aluminum oxide, hafnium oxide, yttrium oxide, lanthanum oxide, lanthanum aluminate, hafnium aluminate, tantalum oxide, and titanium oxide.

16. The nonvolatile semiconductor memory device according to claim 11, wherein the control gate electrode comprises a silicide film.

17. The nonvolatile semiconductor memory device according to claim 16, wherein the silicide film comprises at least one of a tungsten silicide film, a molybdenum silicide film, a cobalt silicide film, a titanium silicide film, and a nickel silicide film.

18. The nonvolatile semiconductor memory device according to claim 11, wherein the control gate electrode comprises a polysilicon film.

19. The nonvolatile semiconductor memory device according to claim 11, wherein the control gate electrode comprises a structure in which a polysilicon film and a silicide film are stacked.

20. The nonvolatile semiconductor memory device according to claim 19, wherein the silicide film comprises at least one of a tungsten silicide film, a molybdenum silicide film, a cobalt silicide film, a titanium silicide film, and a nickel silicide film.

* * * * *